(12) United States Patent
Mori et al.

(10) Patent No.: US 10,236,370 B2
(45) Date of Patent: Mar. 19, 2019

(54) SEMICONDUCTOR DEVICE AND METHOD OF MANUFACTURING THE SAME, POWER CONVERTER, THREE-PHASE MOTOR SYSTEM, AUTOMOBILE AND RAILWAY VEHICLE

(71) Applicant: Hitachi, Ltd., Chiyoda-ku, Tokyo (JP)

(72) Inventors: Yuki Mori, Tokyo (JP); Akio Shima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/759,790

(22) PCT Filed: Sep. 15, 2015

(86) PCT No.: PCT/JP2015/076131
§ 371 (c)(1),
(2) Date: Mar. 13, 2018

(87) PCT Pub. No.: WO2017/046868
PCT Pub. Date: Mar. 23, 2017

(65) Prior Publication Data
US 2018/0350973 A1    Dec. 6, 2018

(51) Int. Cl.
*B60L 15/00* (2006.01)
*H01L 29/06* (2006.01)
(Continued)

(52) U.S. Cl.
CPC .......... *H01L 29/7811* (2013.01); *B60L 15/00* (2013.01); *H01L 21/0465* (2013.01); (Continued)

(58) Field of Classification Search
CPC ............... H01L 29/063; H01L 29/1608; H01L 29/7811; H01L 29/66068; H01L 29/1095; H02P 27/04; H02P 27/06; B60L 2200/26
USPC ....... 438/6, 931, 15, 68, 113, 142, 161, 197, 438/222, 226, 269, 270, 357, 412, 413, 438/416, 442, 460, 719; 318/400.01, 700, 318/701, 727, 800, 801
See application file for complete search history.

(56) References Cited

U.S. PATENT DOCUMENTS 7,633,120 B2 * 12/2009 Hebert .............. H01L 21/26586
257/330
8,124,983 B2 * 2/2012 Otremba ............... H01L 29/205
257/77
(Continued)

FOREIGN PATENT DOCUMENTS

JP    2005-175161 A    6/2005
JP    2009-94433 A    4/2009
(Continued)

OTHER PUBLICATIONS

Japanese-language International Search Report (PCT/ISA/210) issued in PCT Application No. PCT/JP2015/076131 with English translation dated Dec. 28, 2015 (Four (4) pages).
(Continued)

*Primary Examiner* — Antony M Paul
(74) *Attorney, Agent, or Firm* — Crowell & Moring LLP

(57) ABSTRACT

An object of the present invention is to suppress energization deterioration due to crystal defects in a semiconductor device including SiC-MOSFET. To solve this problem, a semiconductor device of the present invention includes: an n⁻-type epitaxial layer formed on a main surface of an n⁺-type SiC substrate; a p-type termination region that is annularly formed in the n⁻-type epitaxial layer outside an active region; and an n-type hole annihilation region annularly formed in the n⁻-type epitaxial layer outside the p-type termination region, apart from the p-type termination region. Then, the n-type hole annihilation region has a first end surface facing the p-type termination region, as well as a second end surface on the opposite side of the first end surface. When a depth of the n-type hole annihilation region is $d_{TM}$, a depth of the p-type termination region is $d_{NR}$, a thickness of the n⁻-type epitaxial layer is $d_{Epi}$, a distance from the first end surface of the n-type hole annihilation region to the second end surface thereof is $L_{NR}$, and a distance from the first end surface of the n-type hole annihilation region to the periphery of the semiconductor substrate is $|X_{NR}|$, these variables have the following relationship: $d_{NR} \leq d_{TM}$, $(|X_{NR}|+d_{NR}) \geq d_{Epi}$, $0 < L_{NR} < |X_{NR}|$.

15 Claims, 15 Drawing Sheets

(51) Int. Cl.
*H01L 29/78* (2006.01)
*H02P 27/06* (2006.01)
*H01L 29/16* (2006.01)
*H01L 29/167* (2006.01)
*H01L 29/10* (2006.01)
*H01L 29/66* (2006.01)
*H01L 21/04* (2006.01)

(52) U.S. Cl.
CPC ........ *H01L 29/063* (2013.01); *H01L 29/0623* (2013.01); *H01L 29/1095* (2013.01); *H01L 29/167* (2013.01); *H01L 29/1608* (2013.01); *H01L 29/66068* (2013.01); *H01L 29/7805* (2013.01); *H02P 27/06* (2013.01); *B60L 2200/26* (2013.01)

(56) References Cited

U.S. PATENT DOCUMENTS

| | | | |
|---|---|---|---|
| 8,227,315 B2 * | 7/2012 | Hebert | H01L 21/26586 257/330 |
| 8,227,811 B2 | 7/2012 | Mizukami et al. | |
| 8,283,973 B2 * | 10/2012 | Hashimoto | H01L 29/66068 257/299 |
| 8,487,374 B2 * | 7/2013 | Ohta | H01L 29/0634 257/334 |
| 9,166,036 B2 * | 10/2015 | Tamaki | H01L 29/7811 |
| 9,312,332 B2 * | 4/2016 | Lu | H01L 29/0653 |
| 2012/0074491 A1 | 3/2012 | Ohta et al. | |
| 2014/0246755 A1 | 9/2014 | Yoshimura et al. | |

FOREIGN PATENT DOCUMENTS

| | | |
|---|---|---|
| JP | 2012-59870 A | 3/2012 |
| JP | 2012-74441 A | 4/2012 |
| WO | WO 2013/100155 A1 | 7/2013 |

OTHER PUBLICATIONS

Japanese-language Written Opinion (PCT/ISA/237) issued in PCT Application No. PCT/JP2015/076131 dated Dec. 28, 2015 (Five (5) pages).

* cited by examiner

SEMICONDUCTOR DEVICE AND METHOD OF MANUFACTURING THE SAME, POWER CONVERTER, THREE-PHASE MOTOR SYSTEM, AUTOMOBILE AND RAILWAY VEHICLE

TECHNICAL FIELD

The present invention relates to a semiconductor device and a method of manufacturing the same, a power converter, a three-phase motor system, an automobile, and a railway vehicle.

BACKGROUND ART

As the background art of this technical field, there is Japanese Unexamined Patent Application Publication No. 2012-59870 (Patent Literature 1). This publication describes a semiconductor device including: a first wide bandgap semiconductor region of a first conductivity type; a second wide bandgap semiconductor region of a second conductivity type formed so as to be sandwiched between the first semiconductor regions; and a plurality of third wide bandgap semiconductor regions of the second conductivity type, each of which is formed so as to be at least partially connected to the second semiconductor region and to be sandwiched between the first semiconductor regions. When the width of wide bandgap semiconductor layer of the first conductivity type is d, the interval between the third semiconductor regions is 2d×tan 18° or more.

CITATION LIST

Patent Literature

Patent Literature 1: Japanese Unexamined Patent Application Publication No. 2012-59870

SUMMARY OF INVENTION

Technical Problem

For example, as a switching element of power module that configures a power converter, SiC-MOSFET (Metal Oxide Semiconductor Field Effect Transistor) is being developed by using SiC (silicon carbide) with a breakdown field higher than Si (silicon). In general, a freewheeling diode is provided outside the SiC-MOSFET in order to suppress the leakage current in the backward operation by reducing the electric field on the interface (Schottky interface) between metal and semiconductor when a voltage is applied in the opposite direction.

Meanwhile, in order to downsize the power module, it is desirable that a freewheeling diode is incorporated into a substrate in which SiC-MOSFET is formed. However, when the return current flows through the built-in freewheeling diode (hereinafter, referred to as the body diode), "energization deterioration" is likely to occur due to crystal defects of SiC. Energization deterioration is a phenomenon such as an increase in the on-resistance which is the resistance in the energization of the SiC-MOSFET. The greater the on-resistance, the greater the loss and the more heat is generated, which affects the life or performance of the power module.

Crystal defects of SiC, which are mainly stacking faults and micro defects as the origin of the stacking faults, are present in a manufactured SiC wafer. However, a large number of stacking faults also occur starting from defects occurring in the dicing surface in dicing of the SiC wafer. The crystal defects present in the manufactured SiC wafer can be reduced by improving the SiC wafer itself as well as the epitaxial growth on the SiC wafer. However, it is very difficult to reduce the number of defects that occur in the dicing surface in dicing of the SiC wafer. For this reason, the influence of the stacking faults that occur starting from the defects on energization deterioration of the SiC-MOSFET is significant.

Solution to Problem

In order to solve the above problems, the semiconductor device according to the present invention includes: an $n^-$-type epitaxial layer formed on a main surface of an $n^+$-type SiC substrate; a p-type termination region annularly formed in the $n^-$-type epitaxial layer outside an active region; and an n-type hole annihilation region annularly formed in the n type epitaxial layer outside a p-type termination region, apart from the p type termination region. Further, the n-type hole annihilation region has a first end surface facing a p-type termination region as well as a second end surface on the opposite side of the first end surface. Then, when a depth of then-type hole annihilation region is $d_{TM}$, a depth of the p-type termination region is $d_{NR}$, the thickness of the $n^-$-type epitaxial layer is $d_{Epi}$, a distance from the first end surface of the n-type hole annihilation region to the second end surface thereof is $L_{NR}$, and a distance from the first end surface of the n-type hole annihilation region to the periphery of the semiconductor device is $|X_{NR}|$, these variables have the following relationship: $d_{NR} \geq d_{TM}$, $(|X_N|+d_{NR}) \geq d_{Epi}$, $0 < L_{NR} < |X_{NR}|$.

Advantageous Effects of Invention

According to the present invention, it is possible to suppress energization deterioration due to crystal defects in a semiconductor device including SiC-MOSFET.

The problems, configurations, and effects other than those described above will become apparent from the following description of exemplary embodiments.

DESCRIPTION OF EMBODIMENTS

Figure 1:
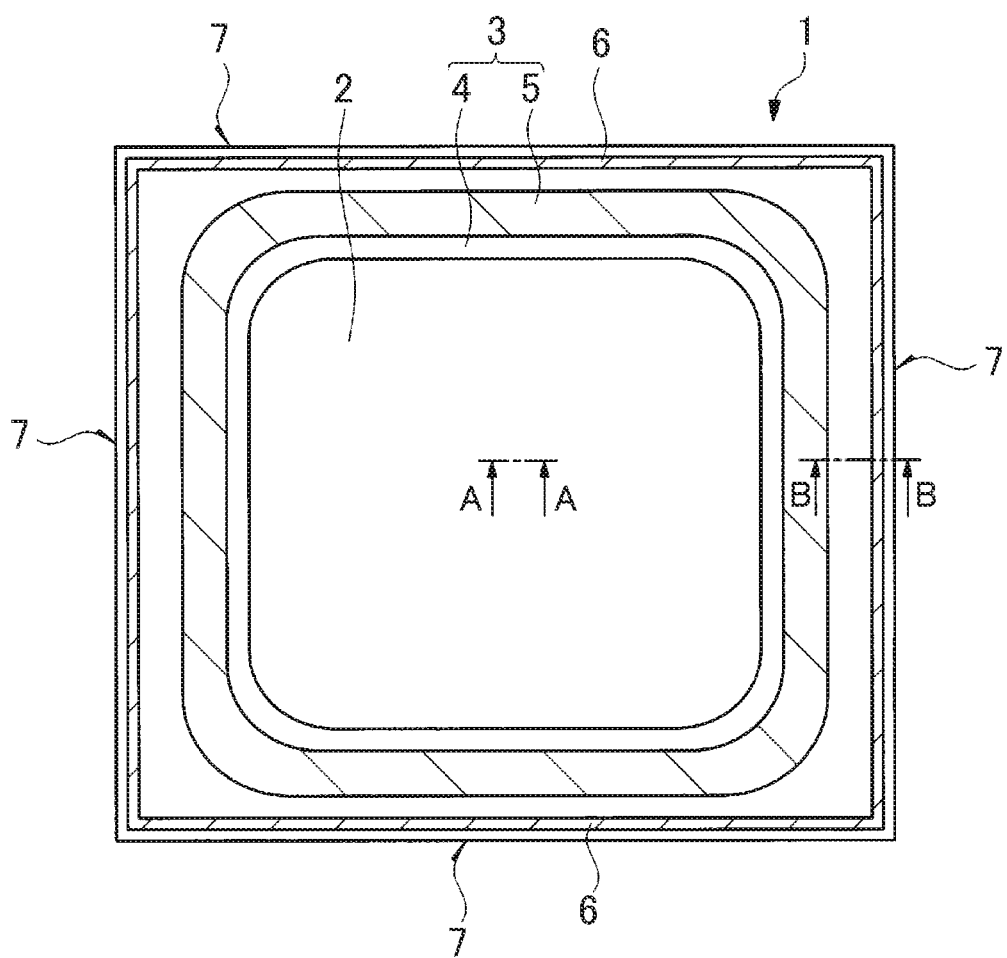
FIG. 1 is a fragmentary plan view showing an example of a semiconductor device (semiconductor chip) according to a first embodiment.

The following embodiments will be explained by dividing them into a plurality of sections or embodiments, if necessary for convenience. However, they are not irrelevant to each other unless expressly stated otherwise, and are involved in relationships in which one is a variation, detail, supplement of a part or whole of the others.

Further, in the following embodiments, when referring to the number of elements (including the number of pieces, numerical value, amount, range, and the like), the number of elements is not limited to a specific number unless expressly stated otherwise and unless the number is clearly limited to a specific number in principle or other reasons. The number of elements can be greater or smaller than the specific number.

Further, in the following embodiments, it goes without saying that the components (including element steps and the like) are not necessarily required, unless expressly stated otherwise and unless they are considered to be clearly required in principle or other reasons.

In addition, when referring to "including A", "composed of A", "having A", and "including A", it goes without saying that the elements other than the specified one should not be excluded, unless expressly stated the fact that there is only the particular element, or other reasons. Also, in the following embodiment, when referring to the shape, the positional relationship, or other characteristics of the components and the like, elements that substantially approximate or similar to the shape or other characteristics are included unless expressly stated otherwise and unless they are clearly considered not to be so in principle.

Further, in the drawings used in the following embodiments, hatching may be used even in a plan view, to make the figure easy to understand. Further, in principle, elements having the same functions are denoted by the same reference numerals in all the drawings for describing the embodiments below, and the repetitive description thereof will be omitted. Hereinafter, preferred embodiments of the present invention will be described in detail with reference to the accompanying drawings.

First Embodiment

<Structure of a Semiconductor Device>

Figure 2:
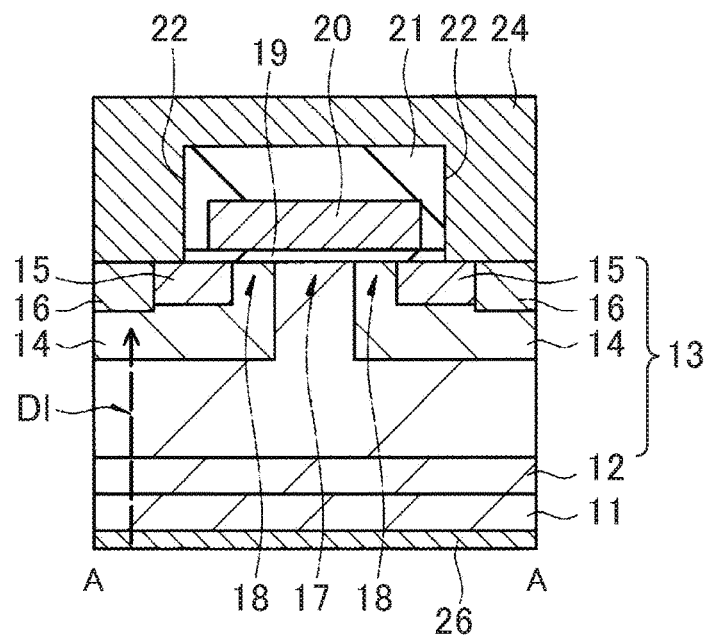
FIG. 2 is a fragmentary cross-sectional view showing an example of SiC-MOSFET according to the first embodiment.
Figure 3:
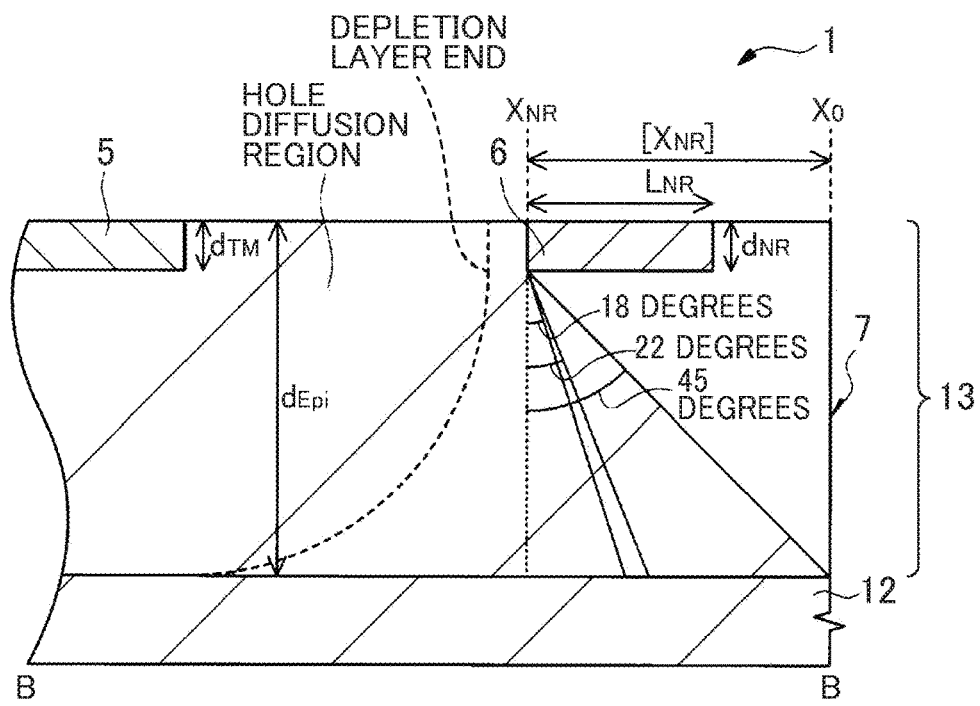
FIG. 3 is a fragmentary cross-sectional view showing an enlarged part of the end portion of the semiconductor device (semiconductor chip) according to the first embodiment.

A semiconductor device according to a first embodiment will be described with reference to FIGS. 1 to 3. FIG. 1 is a fragmentary plan view showing an example of the semiconductor device (semiconductor chip) according to the first embodiment. FIG. 2 is a fragmentary cross-sectional view showing an example of SiC-MOSFET according to the first embodiment (which is a cross-sectional view taken along line A-A shown in FIG. 1). The SiC-MOSFET is MOSFET of planar type DMOS (Double diffused Metal Oxide Semiconductor) structure. FIG. 3 is a fragmentary cross-sectional view showing an enlarged part of the end portion of the semiconductor device (semiconductor chip) according to the first embodiment (which is a cross-sectional view taken along line B-B shown in FIG. 1).

As shown in FIG. 1, a semiconductor device (a semiconductor chip) 1 is configured with an active region (element formation region, activation region) 2 through which current mainly flows, and a peripheral region 3 formed around the active region 2 in a plan view.

For example, a plurality of n-channel type SiC-MOSFETs are connected in parallel to the active region 2. Further, in order to prevent concentration of electric fields, a termination structure of, for example, $p^+$-type semiconductor region 4 and p-type termination region (termination) 5 is formed in the peripheral region 3. In other words, the p-type termination region 5 is formed so as to surround the $p^+$-type semiconductor region 4. The p-type termination region 5 includes, for example, a junction termination extension (JTE) structure having a single- or multi-stage concentration distribution.

Further, an n-type hole annihilation region 6 is formed apart from the p-type termination region 5 on the side of the outer periphery (peripheral portion, end portion) of the semiconductor device 1 than the peripheral region 3. The n-type hole annihilation region 6 also has a function as a channel stopper. The outer periphery of the semiconductor device 1 is a dicing surface 7 that is formed in dicing for cutting a plurality of semiconductor chips from a semiconductor wafer.

FIG. 2 shows an example of the structure of the SiC-MOSFET formed in the active region 2.

An n-type buffer layer 12 composed of SiC with an impurity concentration lower than the impurity concentration of an $n^+$-type SiC substrate 11 is formed on a surface (first main surface) of the $n^+$-type SiC substrate 11 composed of SiC. Then, an $n^-$-type epitaxial layer 13 composed of SiC with an impurity concentration lower than the impurity concentration of the n-type buffer layer 12 is formed on the upper surface of the n-type buffer layer 12.

In the first embodiment, the n-type buffer layer 12 is formed by an epitaxial growth method similarly to the $n^-$-type epitaxial layer 13. However, the n-type buffer layer 12 can also be formed by an ion implantation method. The thickness of the n-type buffer layer 12 is, for example, about 3 to 20 μm, and the thickness of the $n^-$-type epitaxial layer 13 is, for example, about 5 to 50 μm. Note that the n-type buffer 12 is formed in the first embodiment, but it may also be possible to directly form the n⁻-type epitaxial layer 13 on the surface of the n⁺-type SiC substrate 11, without forming the n-buffer layer 12.

A plurality of p-type body regions (well regions) 14 are formed apart from each other within the n⁻-type epitaxial layer 13, with a predetermined depth from the upper surface of the n⁻-type epitaxial layer 13. The depth of the p-type body region 14 from the upper surface of the n⁻-type epitaxial layer 13 is, for example, about 0.5 to 2 μm.

An n⁺-type source region 15 is formed within the p-type body region 14, with a predetermined depth from the upper surface of the n⁻-type epitaxial layer 13. The n⁺-type source region 15 is formed within the p-type body region 14, apart from the end surface of the p-type body region 14. The depth of the n⁺-type source region 15 from the upper surface of the n⁻-type epitaxial layer 13 is, for example, about 0.05 to 0.5 μm.

Further, a p⁺-type potential fixing region 16 for fixing the potential of the p-type body region 14 is formed within the p-type body region 14, with a predetermined depth from the upper surface of the n⁻-type epitaxial layer 13. The depth of the p⁺-type potential fixing region 16 from the upper surface of the n⁻-type epitaxial layer 13 is, for example, about 0.05 to 0.5 μm.

The region sandwiched between adjacent p-type body regions 14 is the portion that functions as a JFET (Junction Field Effect Transistor) region (doped region) 17. Further, the p-type body region 4, which is located between the end surface of the p-type body region 14 (the interface between the JFET region 17 and the p-type body region 14) and the end surface of the n⁺-type source region 15 (the interface between the p-type body region 14 and the n⁺-type source region 15), is the portion that functions as a channel region 18.

Of the n⁻-type epitaxial layer 13, the region in which the p-type body region 14 and the JFET region 17 are not formed is a region that functions as an n drift layer for enhancing the breakdown voltage. Further, the n⁺-type SiC substrate 11 is a region that functions as a drain layer.

Further, as indicated by the arrow in FIG. 2, a built-in diode, namely, a body diode DI is formed which includes the p⁺-type potential fixing region 16, the p-type body region 14, the n⁻-type epitaxial layer 13, the n-type buffer layer 12, and the n⁺-type SiC substrate 11, between a source wiring electrode 24 and a drain wiring electrode 16.

Note that "⁻" and "⁺" are signs that indicate relative impurity concentrations with the conductivity type of n-type or p-type. For example, the impurity concentration of n-type impurity increases in the order from "n⁻", "n", "n⁺", and the impurity concentration of p-type impurity increases in the order from "p⁻", "p", "p⁺".

The preferred impurity concentration range of the n⁺-type SiC substrate 11 is, for example, about $1 \times 10^{18}$ to $1 \times 10^{21}$ cm⁻³, the preferred impurity concentration range of the n-type buffer layer 12 is, for example, about $1 \times 10^{17}$ to $1 \times 10^{19}$ cm⁻³, and the preferred impurity concentration range of the n⁻-type epitaxial layer 13 is, for example, about $1 \times 10^{14}$ to $1 \times 10^{16}$ cm⁻³. Further, the preferred impurity concentration range of the p-type body region 14 is, for example, about $1 \times 10^{17}$ to $1 \times 10^{18}$ cm⁻³, the preferred impurity concentration range of the n⁺-type source region 15 is, for example, about $1 \times 10^{19}$ to $1 \times 10^{20}$ cm⁻³, the preferred impurity concentration range of the p⁺-type potential fixing region 16 is, for example, about $1 \times 10^{19}$ to $1 \times 10^{20}$ cm⁻³, and the preferred impurity concentration range of the JFET region 17 is, for example, about $3 \times 10^{16}$ cm⁻³. Further, the preferred impurity concentration range of the n-type hole annihilation region 6 shown in FIG. 1 is, for example, about $1 \times 10^{15}$ to $1 \times 10^{22}$ cm⁻³, the preferred impurity concentration region of the p⁺-type semiconductor region 4 is, for example, about $1 \times 10^{19}$ to $1 \times 10^{20}$ cm⁻³, and the preferred impurity concentration region of the p-type termination region 5 is, for example, about $1 \times 10^{17}$ to $1 \times 10^{18}$ cm⁻³.

A gate insulating film 19 is formed over the channel region 18, and a gate electrode 20 is formed over the gate insulating film 19. The gate electrode 20 is formed in a band shape in a plan view. Then, the p-type body region 14 is formed between adjacent gate electrodes 20 that are spaced apart from each other. Note that the layout of the SiC-MOSFET is not limited to this. For example, it may be possible that the gate electrode 20 is formed in a lattice pattern in a plan view and then the p-type body region 14 is formed to be surrounded by the gate electrode 20.

The gate insulating film 19 and the gate electrode 20 are covered by an interlayer insulating film 21. Part of the n⁺-type source region 15 as well as the p⁺-type potential fixing region 16 are exposed in the bottom of an opening 22 formed in the interlayer insulating film 21. Note that a metal silicide layer may be formed on these surfaces. Further, part of the n⁺-type source region 15 as well as the p⁺-type potential fixing region 16 are electrically connected to the source wiring electrode 24. Further, although not shown, the gate electrode 20 is electrically connected to the gate wiring electrode.

The back surface (second main surface) of the n⁺-type SiC substrate 11 is electrically connected to the drain wiring electrode 26. Note that a metal silicide layer may be formed on the back surface of the n⁺-type SiC substrate 11. The source potential is applied from the outside to the source wiring electrode 24, the drain potential is applied from the outside to the drain wiring electrode 26, and the gate potential is applied from the outside to the gate wiring electrode.

FIG. 3 shows an example of the arrangement of the p-type termination region 5 and the n-type hole annihilation region 6, both of which are formed in the end portion of the semiconductor device 1.

The n-type hole annihilation region 6 is formed apart from the p-type termination region 5 and also apart from the outer periphery of the semiconductor device 1, around the p-type termination region 5 in a plan view. The outer periphery of the semiconductor device 1 is the dicing surface 7 that is formed in dicing process in which a plurality of semiconductor chips are cut out of a semiconductor wafer. In the first embodiment, the position of the dicing surface 7 of the semiconductor device 1 is referred to as $X_0$, the position of the end surface of the n-type hole annihilation region 6 that faces the p-type termination region 5 is referred to as $X_{NR}$, and the distance between the dicing surface 7 of the semiconductor device 1 and the end surface of the n-type hole annihilation region 6 that faces the p-type termination region 5 is referred to as $|X_{NR}|$.

The n-type hole annihilation region 6 has a predetermined width ($L_{NR}$) in a plan view. The width ($L_{NR}$) is set smaller than $|X_{NR}|$ which is the distance between the dicing surface 7 of the semiconductor device 1 and the end surface of the n-type hole annihilation region 6 that faces the p-type termination region 5. The width ($L_{NR}$) of the n-type hole annihilation region 6 can be, for example, about 1 μm. Further, the distance between the p-type termination region 5 and the n-type hole annihilation region 6 is set according to the breakdown voltage of the semiconductor device 1 in such a way that the depletion layer end extending from the p-type termination region 5 at the time of non-energization (off state) does not reaches the n-type hole annihilation region 6 and punch-through does not occur.

Further, the n-type hole annihilation region 6 has a predetermined depth ($d_{NR}$) from the upper surface of the n⁻-type epitaxial layer 13. The depth ($d_{NR}$) is equal to or more than the depth ($d_{TM}$) of the p-type termination region 5, which is located at a position closest to the n-type hole annihilation region 6, from the upper surface of the n⁻-type epitaxial layer 13. The depth ($d_{NR}$) of the n-type hole annihilation region 6 can be, for example, about 0.5 μm.

Further, the n-type hole annihilation region 6 is formed in such a way that the sum of the distance ($|X_{NR}|$) from the dicing surface 7 of the semiconductor device 1 to the end surface of the n-type hole annihilation region 6 that faces the p-type termination region 5, and the depth ($d_{NR}$) of the n-type hole annihilation region 6 is equal to or more than the thickness ($d_{Epi}$) of the n⁻-type epitaxial layer 13.

To summarize the above, the following equation is obtained:

$$d_{NR} \geq d_{TM}$$

$$(|X_{NR}| + d_{NR}) \geq d_{Epi}$$

$$0 < L_{NR} < |X_{NR}|$$

<Main Effect of SiC-MOSFET According to the First Embodiment>

The effect obtained by forming the n-type hole annihilation region 6 to satisfy the above equation will be described below with reference to FIG. 3.

A semiconductor wafer in which many semiconductor chips are formed is cut along scribe regions (also referred to as dicing regions or cutting margins) provided on the four sides of each of the semiconductor chips, and is separated into individual semiconductor chips. In the dicing process, a defect occurs in the dicing surface of the semiconductor chip, and a number of stacking faults occur within the SiC crystal starting from the defect occurring in the dicing surface.

According to the study of the present inventors, it was found that when a hole was induced in the dicing surface, a number of stacking faults occurred within the SiC crystal starting from a defect occurring in the dicing surface.

More specifically, the present inventors conducted an ultraviolet irradiation experiment on the semiconductor chip after dicing. In other words, the present inventors have studied the relationship between holes and defects that occur in the dicing surface, by taking advantage of the phenomenon that when holes induced by ultraviolet light within the SiC crystal recombine with electrons in stacking faults or in micro defects which are the origin of the stacking faults, these defects are extended and the incident light intensity is increased. Ultraviolet light was emitted obliquely from above the semiconductor chip. As a result, it was found that although the incident light intensity at the dicing surface of the semiconductor chip was dependent on the emission direction of the ultraviolet light, the incident light intensity at the surface other than the dicing surface of the semiconductor chip was independent of the irradiation direction of the ultraviolet light. From this fact, it was believed that the stacking faults, which grow depending on the emission direction of the ultraviolet light, occurred from the dicing surface.

Thus, in the first embodiment, as shown in FIG. 3, the n-type hole annihilation region 6 was provided between the p-type termination region 5 and the dicing surface 7 of the semiconductor device 1 in such a way that the holes supplied in the energization did not reach the dicing surface 7 of the semiconductor device 1.

In other words, when holes and electrons are recombined in the defects occurred in the dicing surface 7 of the semiconductor device 1, the defects are further extended by the energy emitted by the recombination of holes and electrons, and as a result, a number of stacking faults occur in the n⁻-type epitaxial layer 13. However, according to the first embodiment, because the n-type hole annihilation region 6 is provided, the holes are recombined and disappear in the n-type hole annihilation region 6 and do not reach the dicing surface 7 of the semiconductor device 1, so that it is possible to suppress the recombination of holes and electrons in the defects occurred in the dicing surface 7 of the semiconductor device 1. As a result, it is possible to prevent the occurrence of stacking faults in the n⁻-type epitaxial layer 13, or the like, starting from the defects occurred in the dicing surface 7 of the semiconductor device 1.

For example, in the energization, when a positive voltage is applied to the p-type termination region 5 and a voltage of 0 V is applied to the n-type buffer layer 12, many of the holes supplied from the p-type termination region 5 diffuse to the n-type buffer layer 12, but at the same time, some of the holes diffuse in the direction of the dicing surface 7 of the semiconductor substrate 1. However, some holes diffusing in the dicing direction of the semiconductor substrate 1 are recombined and disappear in the n-type hole annihilation region 6 and do not reach the dicing surface 7 of the semiconductor device 1. As a result, it is possible to suppress the occurrence of stacking faults starting from the defects occurred in the dicing surface 7 of the semiconductor device 1. In this way, energization deterioration is unlikely to occur even if the return current flows through the body diode DI, so that it is possible to prevent an increase in the electrical resistance, namely, the on-resistance when the on current flows through the semiconductor device 1.

Further, in the first embodiment, energization deterioration is unlikely to occur even if the return current flows through the body diode DI incorporated into the semiconductor device 1, so that there is no need to provide an external diode separately from the body diode DI incorporated into the semiconductor device 1. As a result, the power module and the power converter can be miniaturized.

Meanwhile, as described above, some holes also diffuse in the direction of the dicing surface 7 of the semiconductor device 1. Thus, even if the n-type hole annihilation region 6 is provided as shown in FIG. 3, there is a possibility that the holes will reach the dicing surface 7 of the semiconductor device 1 if the end surface of the n-type hole annihilation region 6 that faces the p-type termination region 5 is close to the dicing surface 7.

Figure 7:
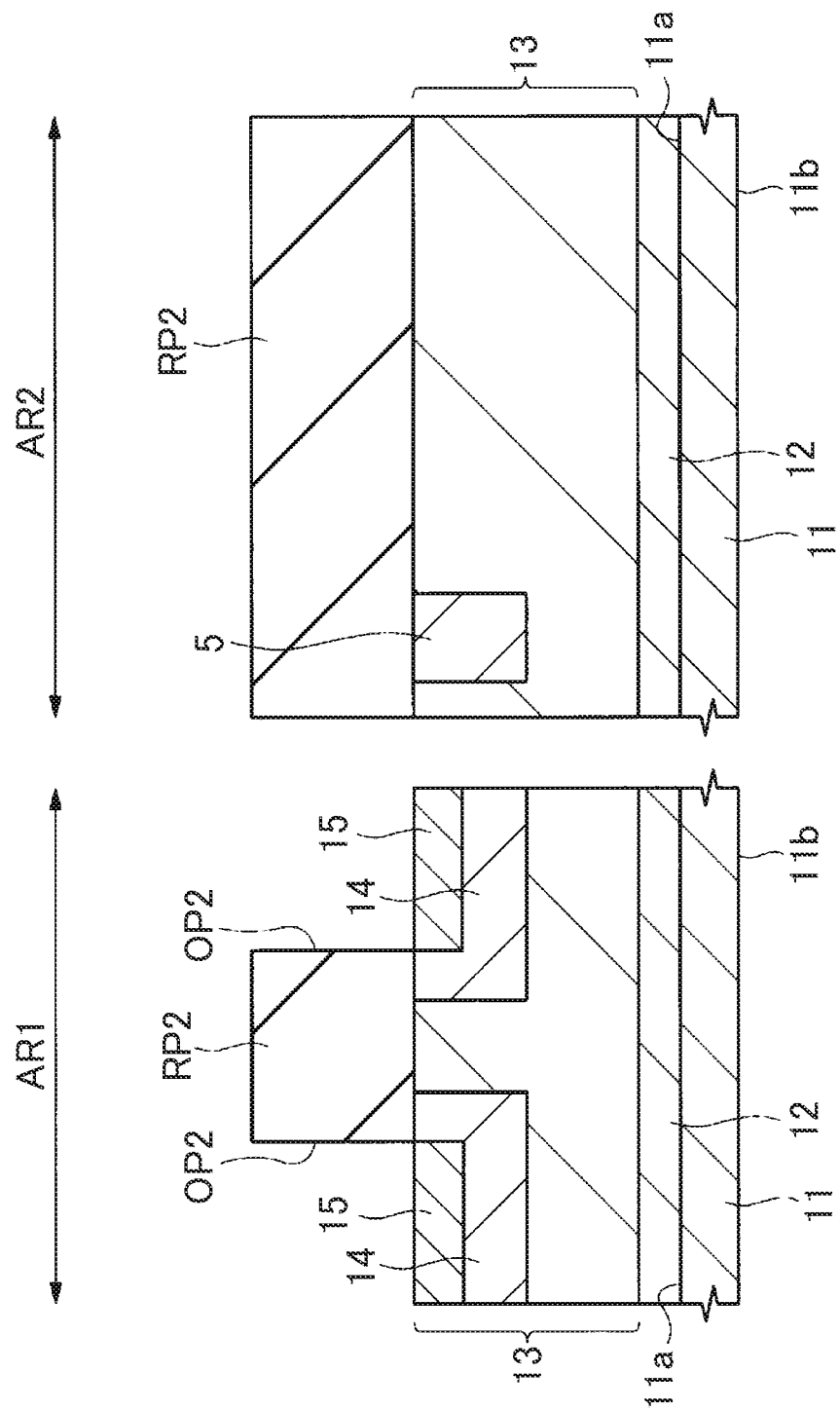
FIG. 7 is a fragmentary cross-sectional view showing the manufacturing process of the semiconductor device, continued from FIG. 6.

For example, the paragraphs [0046] to [0050] of Patent Literature 1 as well as FIG. 7 describe the fact that the concentration of the holes diffusing in the range of 18 degrees in the normal direction of the lower surface of a p⁺-type propagation region is particularly high, and that the concentration of the holes diffusing in the range of 22 degrees is increased. Further as described, for example, in the paragraph [0093] of Japanese Unexamined Patent Application Publication No. 2009-392510, there is a possibility that holes will diffuse at the 45 degree rule.

Thus, in the first embodiment, the position of the n-type hole annihilation region 6 is set by taking into account the diffusion of holes in the direction of the dicing surface 7 of the semiconductor substrate 1. In other words, as described above, the n-type hole annihilation region 6 is provided in such a way that the sum of the distance ($|X_{NR}|$) between the dicing surface 7 of the semiconductor device 1 and the end surface of the n-type hole annihilation region 6 that faces the p-type termination region 5, and the depth ($d_{NR}$) of the n-type hole annihilation region 6 is equal to or more than the thickness ($d_{Epi}$) of the n⁻-type epitaxial layer 13.

<Method of Manufacturing a Semiconductor Device>

Figure 4:
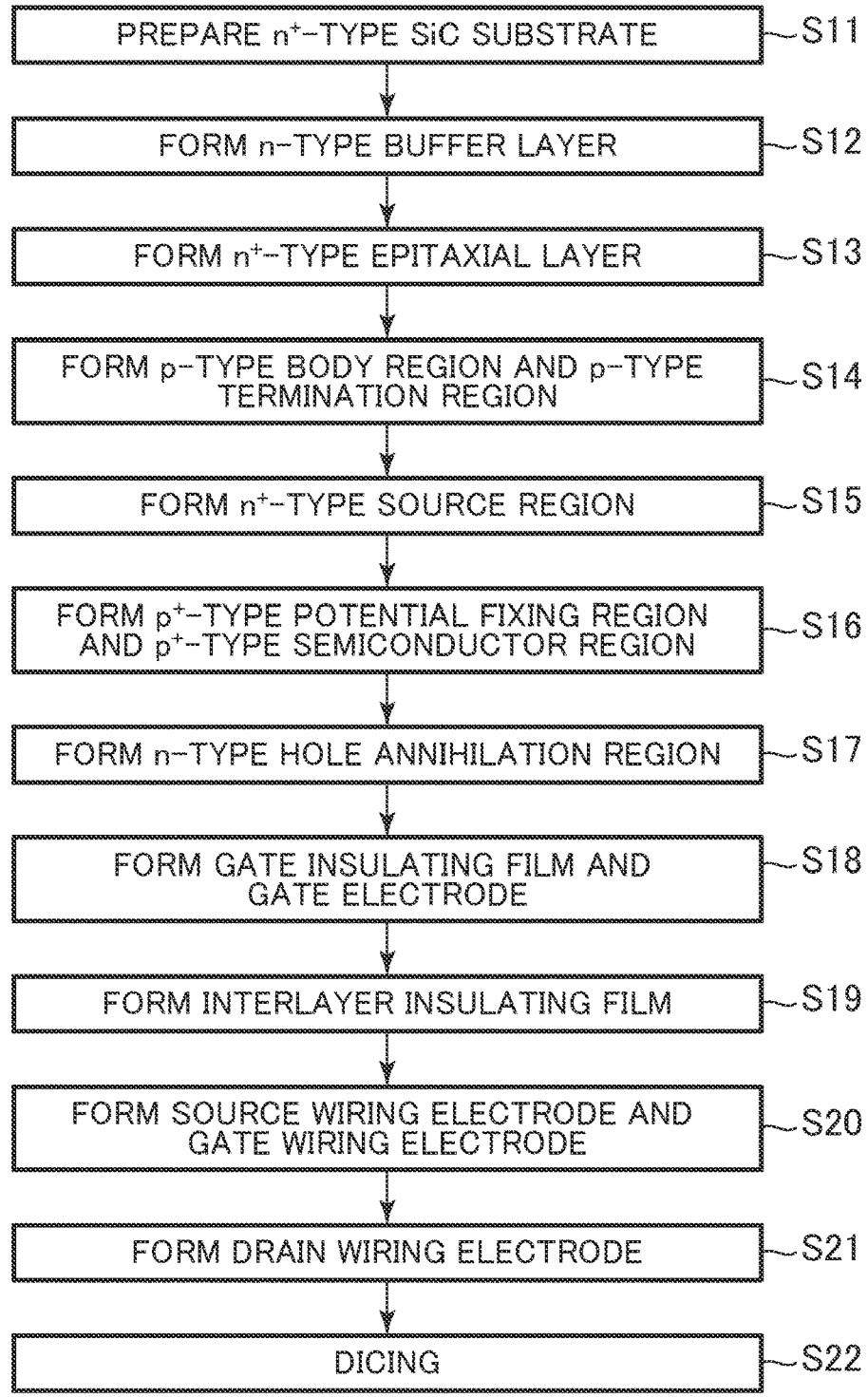
FIG. 4 is a flow chart illustrating an example of a manufacturing process of the semiconductor device according to the first embodiment.

Next, an example of a manufacturing method of the semiconductor device according to the first embodiment will be described with reference to FIGS. 4 to 11. FIG. 4 is a flow chart illustrating an example of a manufacturing process of the semiconductor device according to the first embodiment. FIGS. 5 to 11 are fragmentary cross-sectional views showing the manufacturing process of the semiconductor device according to the first embodiment. In FIGS. 5 to 11, AR1 shows the manufacturing process in the active region, while AR2 shows the manufacturing process in the end portion of the semiconductor device (hereinafter referred to as the chip end portion).

Figure 5:
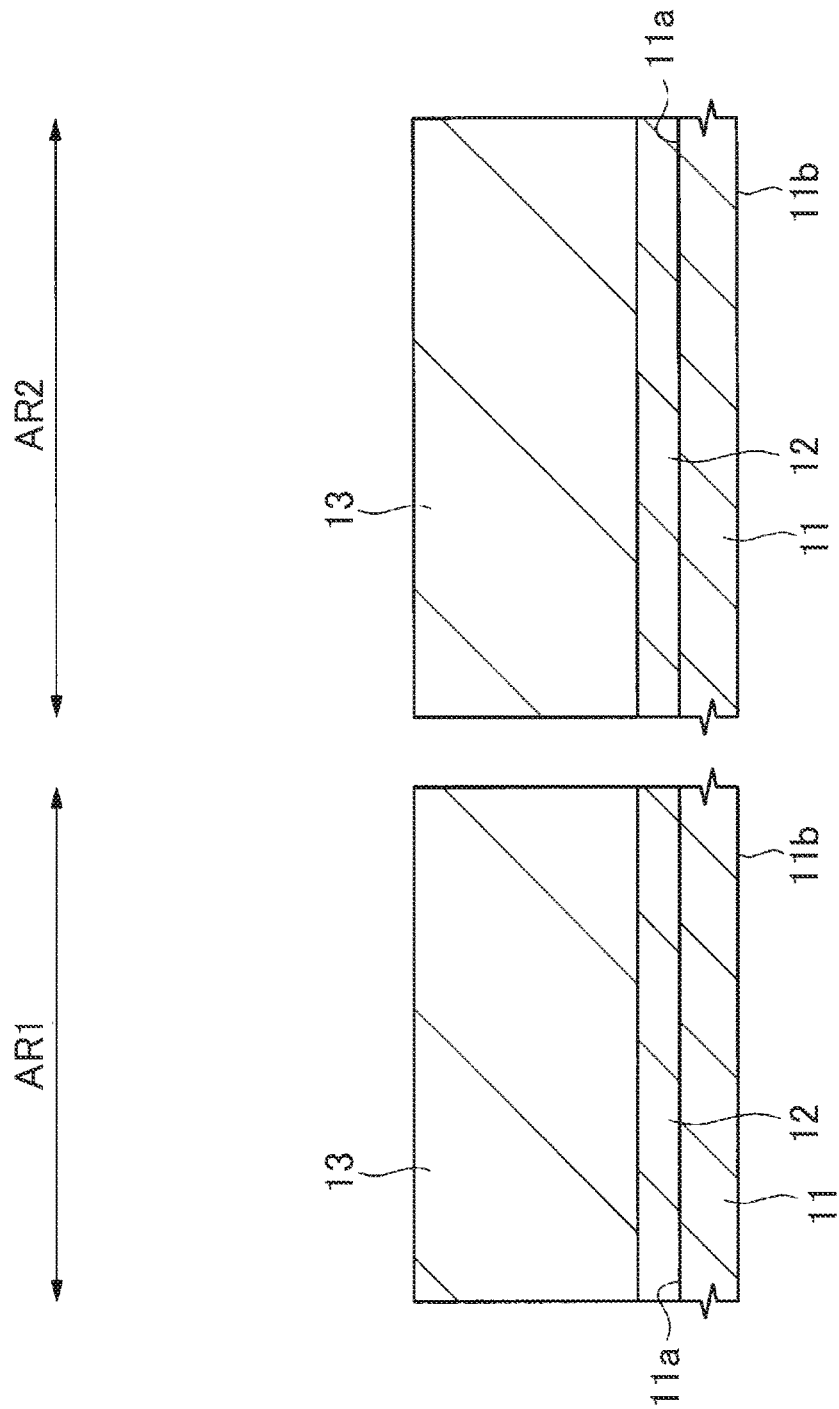
FIG. 5 is a fragmentary cross-sectional view showing the manufacturing process of the semiconductor device according to the first embodiment.

First, as shown in FIG. 5, the method prepares the n⁺-type SiC substrate 11 (step S11 in FIG. 4). For example, the method prepares the n⁺-type SiC substrate 11 including silicon carbide (SiC) in which an n-type impurity such as nitrogen (N) or phosphorus (P) is introduced. The n-type impurity concentration in the n⁺-type SiC substrate 11 is relatively high, for example, about $1 \times 10^{18}$ to $1 \times 10^{21}$ cm⁻³. Further, the thickness of the n⁺-type SiC substrate 11 is, for example, about 50 to 500 μm. Note that in this stage, the n⁺-type SiC substrate 11 is a thin sheet of silicon carbide (SiC) with a substantially circular shape in a plan view, which is called semiconductor wafer. The semiconductor device 1 is formed in each of a plurality of chip regions surrounded by a plurality of first scribe regions separated from each other in a first direction and extending in a second direction perpendicular to the first direction, and by a plurality of second scribe regions separated from each other in the second direction and extending in the first direction.

Next, the method forms the n-type buffer layer 12 (step S12 in FIG. 4). The method forms the buffer layer 12 by an epitaxial growth method on an upper surface 11a of the n⁺-type SiC substrate 11 both in the active region AR1 and the chip end portion AR2. At this time, the method forms the n-type buffer layer 12 including silicon carbide (SiC), for example, by using a process gas such as silicon (Si) atom-containing gas ($SiH_4$ gas), chlorine (Cl) atom-containing gas (HCl gas), carbon (C) atom-containing gas ($C_3H_8$ gas), or reducing gas ($H_2$ gas) with a substrate temperature of, for example, about 1500 to 1800° C.

An n-type impurity such as, for example, nitrogen (N) or phosphorus (P) is introduced in the n-type buffer layer 12. The n-type impurity concentration in the n-type buffer layer 12 is, for example, about $1 \times 10^{17}$ to $1 \times 10^{19}$ cm⁻³, and the thickness of the n-type buffer layer 12 is, for example, about 3 to 20 μm.

Next, the method forms the n⁻-type epitaxial layer 13 (step S13 in FIG. 4). The method forms the n⁻-type epitaxial layer 13 by the epitaxial growth method on the upper surface of the n-type buffer layer 12 both in the active region AR1 and the chip end portion AR2. At this time, the method forms the n⁻-type epitaxial layer 13 including silicon carbide (SiC), for example, by using a process gas such as silicon (Si) atom-containing gas ($SiH_4$ gas), chlorine (Cl) atom-containing gas (HCl gas), carbon (C) atom-containing gas ($C_3H_8$ gas), or reducing gas ($H_2$ gas) with a substrate temperature of, for example, about 1500 to 1800° C.

An n-type impurity such as, for example, nitrogen (N) or phosphorus (P) is introduced in the n⁻-type epitaxial layer 13. The n-type impurity concentration in the n⁻-type epitaxial layer 13 is, for example, about $1 \times 10^{14}$ to $1 \times 10^{16}$ cm⁻³, and the thickness of the n⁻-type epitaxial layer 13 is, for example, about 5 to 50 μm.

Figure 6:
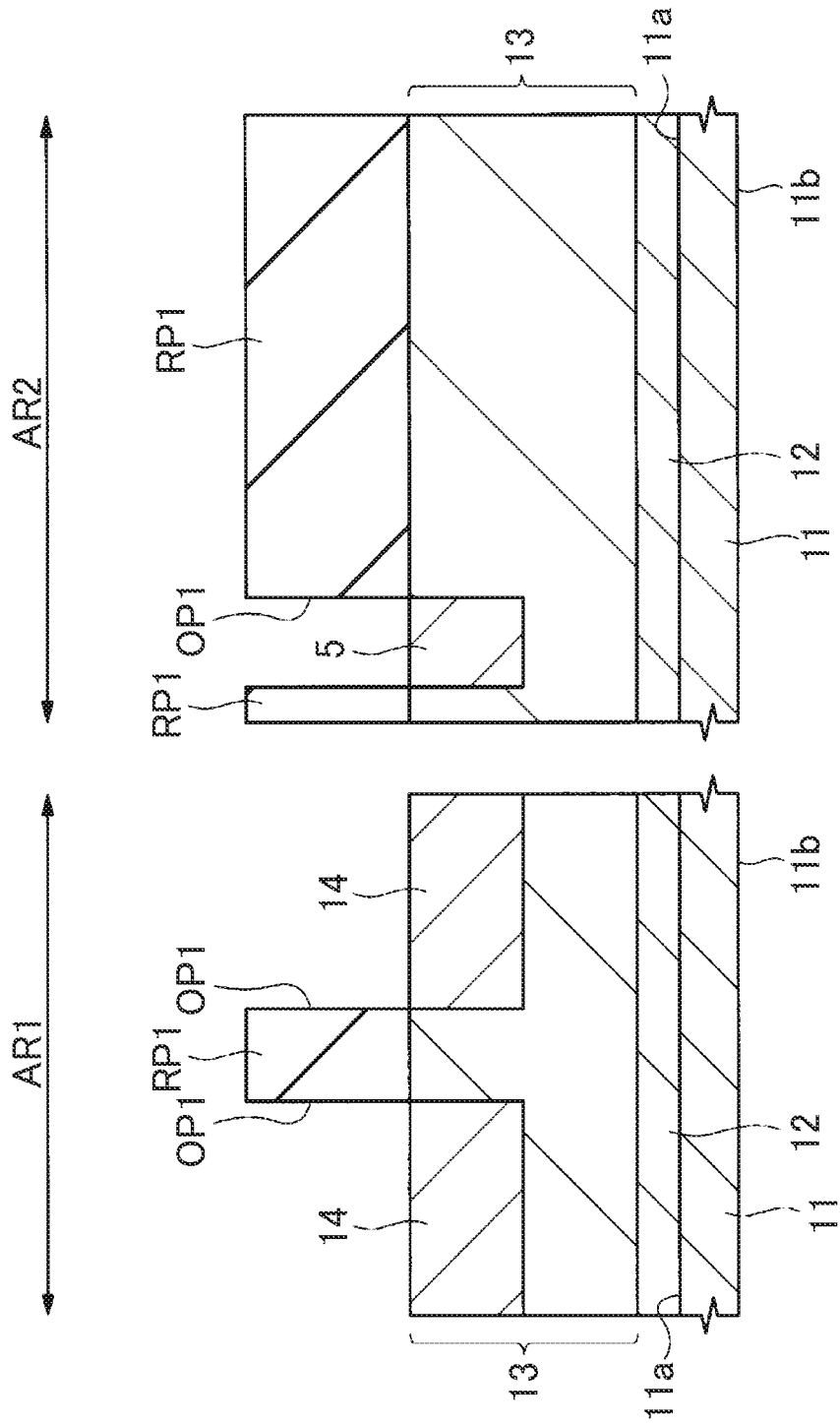
FIG. 6 is a fragmentary cross-sectional view showing the manufacturing process of the semiconductor device, continued from FIG. 5.

Next, as shown in FIG. 6, the method forms the p-type body region 14 and the p-type termination region 5 in each of the chip regions (step S14 in FIG. 4). The method forms a resist pattern RP1 by forming a resist film on the upper surface of the n⁻-type epitaxial layer 13 both in the active region AR1 and the chip end portion AR2, and by performing exposure and development processes on the formed resist film by using a photolithography technique. The resist pattern RP1 has an opening OP1 reaching the n⁻-type epitaxial layer 13 in an area of the active region AR1 in which the p-type body region 14 is formed, and also has an opening OP1 reaching the n⁻-type epitaxial layer 13 in an area of the chip end portion AR2 in which the p-type termination region 5 is formed.

Next, the method introduces a p-type impurity such as, for example, aluminum (Al) or boron (B), into the n⁻-type epitaxial layer 13 of the active region AR1 and the chip end portion AR2 by the ion implantation method with the resist pattern RP1 as a mask. In this way, the p-type body region 14 having a predetermined depth from the upper surface of the n⁻-type epitaxial layer 13 is formed in the active region AR1. Further, the p-type termination region 5 having a predetermined depth from the upper surface of the n⁻-type epitaxial layer 13 is formed in the chip end portion AR2. The p-type impurity concentration in the p-type body region 14 and the p-type termination region 5 is, for example, about $1 \times 10^{17}$ to $1 \times 10^{18}$ cm⁻³, and the depth of the p-type body region 14 and the p-type termination region 5 from the upper surface of the n⁻-type epitaxial layer 13 is, for example, about 0.5 to 2 μm. Then, the resist pattern RP1 is removed.

Note that the p-type impurity concentration in the p-type termination region 5 is preferably lower than the p-type impurity concentration of the p-type body region 14. In this way, it is possible to prevent or suppress the possibility that the intensity of the electric field in the vicinity of the p-type termination region 5 in the chip end portion AR2 will be greater than the intensity of the electric field in the vicinity of the p-type body region 14 in the active region AR1. Thus, the breakdown voltage of the semiconductor device can be increased.

Further, the p-type impurity concentration in the portion of the p-type termination region 5 on the opposite side of the active region AR1 is preferably lower than the p-type impurity concentration in the portion of the p-type termination region 5 on the side of the active region AR1. In this way, it is possible to prevent or suppress the possibility that the intensity of the electric field in the portion of the p-type termination region 5 on the opposite side of the active region AR1 will be greater than the intensity of the electric field in the portion of the p-type termination region 5 on the side of the active region AR1, so that the breakdown voltage of the semiconductor device can be increased. In this case, for example, the formation of the p-type body region 14 and the formation of the p-type termination region 5 should be performed in different steps.

Next, with respect to the step of forming the p-type body region 14 and the p-type termination region 5, after this step is completed, the implanted impurities are activated by performing a heat treatment at about 1700° C.

Next, as shown in FIG. 7, the method forms the n⁺-type source region 15 in each of the chip regions (step S15 in FIG. 4). At this time, the method forms a resist pattern RP2 by forming a resist film on the upper surface of the n⁻-type epitaxial layer 13 both in the active region AR1 and the chip end portion AR2, and by performing exposure and development processes on the formed resist film by using the photolithography technique. The resist pattern RP2 has an opening OP2 reaching the p-type body region 14 in an area of the active region AR1 in which the n$^+$-type source region 15 is formed.

Next, the method introduces an n-type impurity such as, for example, nitrogen (N) phosphorus (P) into the p-type body region 14 of the active region AR1 by the ion implantation method with the resist pattern RP2 as a mask. In this way, the n$^+$-type source region 15 having a predetermined depth from the upper surface of the n$^-$-type epitaxial layer 13 is formed within the p-type body region 13. The n-type impurity concentration in the n$^+$-type source region 15 is, for example, about $1\times10^{19}$ to $1\times10^{20}$ cm$^{-3}$, and the depth of the n$^+$-type source region 15 from the upper surface of the n$^-$-type epitaxial layer 13 is, for example, about 0.05 to 0.5 μm. Then, the resist pattern RP2 is removed.

Figure 8:
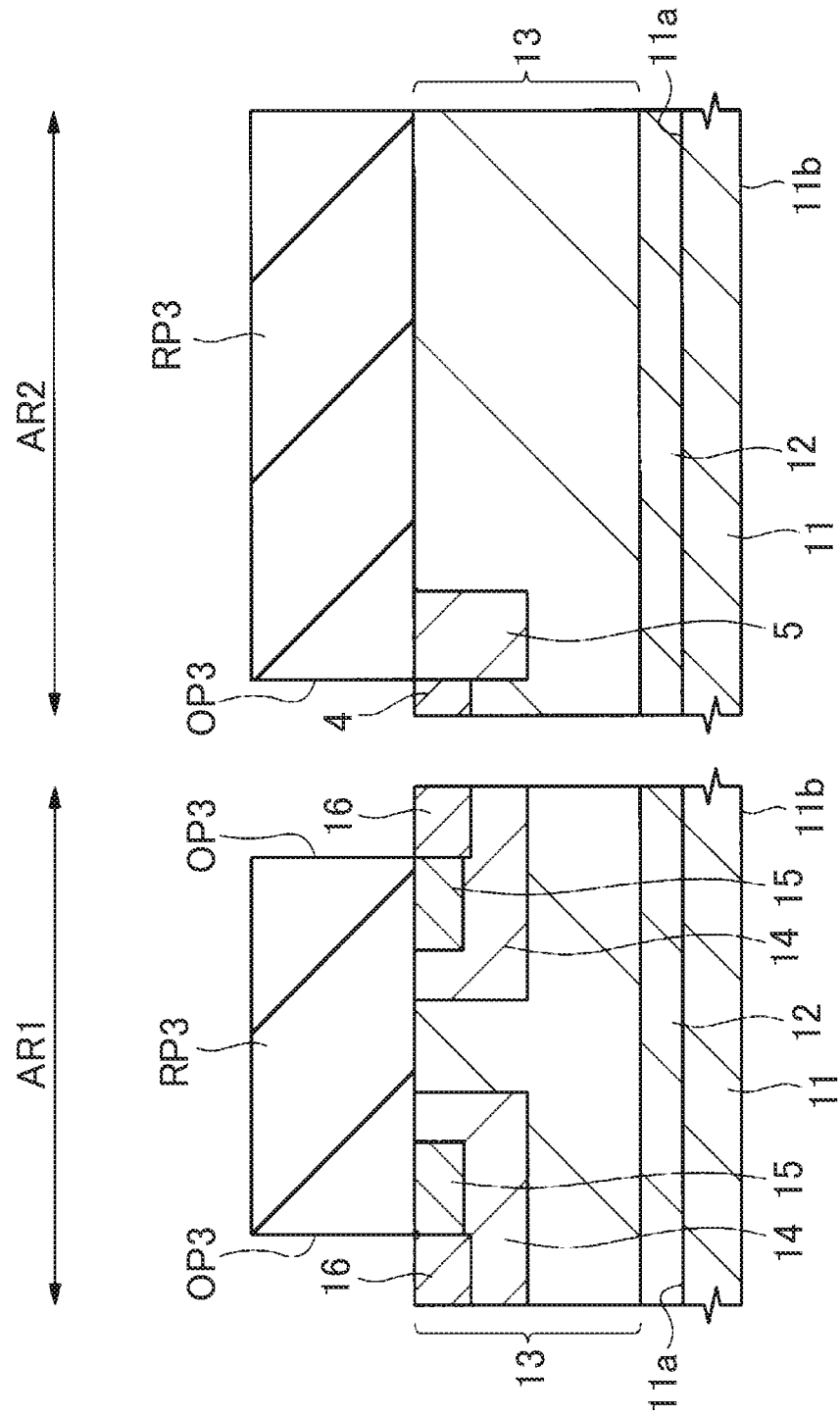
FIG. 8 is a fragmentary cross-sectional view showing the manufacturing process of the semiconductor device, continued from FIG. 7.

Next, as shown in FIG. 8, the method forms the p$^+$-type potential fixing region 16 and the p$^+$-type semiconductor region 4 in each of the chip regions (step S16 in FIG. 4). At this time, the method forms a resist pattern RP3 by forming a resist film on the upper surface of the n$^-$-type epitaxial layer 13 both in the active region AR1 and the chip end portion AR2, and by performing exposure and development processes on the formed resist film by using the photolithography technique. The resist pattern RP3 has an opening OP3 reaching the n$^+$-type source region 15 in an area of the active region AR1 in which the p$^+$-type potential fixing region 16 is formed. Also, the resist pattern RP3 has an opening OP3 reaching the n$^-$-type epitaxial layer 13 in an area of the chip end portion AR2 in which the p$^+$-type semiconductor region 4 is formed.

Next, the method introduces a p-type impurity such as, for example, aluminum (Al) or boron (B), into the n$^+$-type source region 15 of the active region AR1 as well as the n$^-$-type epitaxial layer 13 of the chip end portion AR2, by the ion implantation method with the resist pattern RP3 as a mask. In this way, the p$^+$-type potential fixing region 16 having a predetermined depth from the upper surface of the n$^-$-type epitaxial layer 13 is formed within the n$^+$-type source region 15, and the p$^+$-type semiconductor region 4 having a predetermined depth from the upper surface of the n$^-$-type epitaxial layer 13 is formed in the n$^-$-type epitaxial layer 13 in the chip end portion AR2. The p-type impurity concentration in the p$^+$-type potential fixing region 16 and the p$^+$-type semiconductor region 4 is, for example, about $1\times10^{19}$ to $1\times10^{20}$ cm$^{-3}$. The depth of the p$^+$-type potential fixing region 16 and the p$^+$-type semiconductor region 4 from the upper surface of n$^-$-type epitaxial layer 13 is, for example, about 0.05 to 0.5 μm. Then, the resist pattern RP3 is removed.

Figure 9:
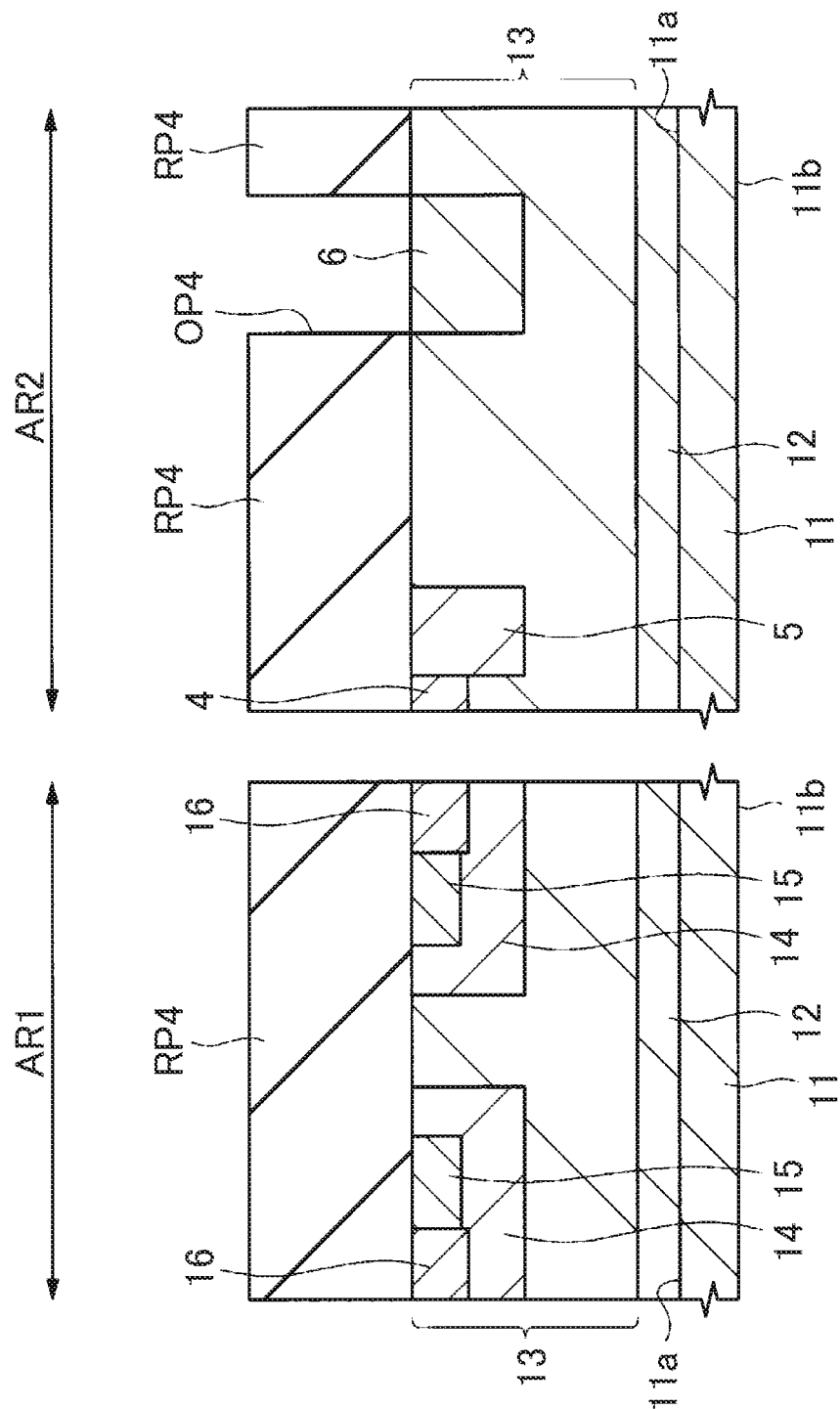
FIG. 9 is a fragmentary cross-sectional view showing the manufacturing process of the semiconductor device, continued from FIG. 8.

Next, as shown in FIG. 9, the method forms the n-type hole annihilation region 6 in each of the chip regions (step S17 in FIG. 7). At this time, the method forms a resist pattern RP4 by forming a resist film on the upper surface of the n$^-$-type epitaxial layer 13, and by performing exposure and development processes on the formed resist film by using the photolithography technique. The resist pattern RP4 has an opening OP4 reaching the n$^-$-type epitaxial layer 13, in an area of the chip end portion AR2 in which the n-type hole annihilation region 6 is formed.

Next, the method introduces an n-type impurity such as, for example, nitrogen (N), phosphorus (P), or arsenic (As), into the n$^-$-type epitaxial layer 13 of the chip end portion AR2, by the ion implantation method with the resist pattern RP4 as a mask. For example, in the case of the semiconductor device 1 having a breakdown voltage of 3.3 keV, the following can be cited as an example of ion implantation conditions of n-type impurities: the energy is 400 keV and the dose amount is $1\times10^{13}$ cm$^{-2}$. In this way, the n-type hole annihilation region 6 is formed with a predetermined depth from the upper surface of the n$^-$-type epitaxial layer 13 in the chip end portion AR2. The p-type impurity concentration in the n-type hole annihilation region 6 is, for example, about $1\times10^{15}$ to $1\times10^{22}$ cm$^{-3}$. The depth of the n-type hole annihilation region 6 from the upper surface of the n$^-$-type epitaxial layer 13 is, for example, about 0.5 μm.

Note that in the first embodiment, the hole annihilation region is configured with the n-type hole annihilation region 6 which is formed by introducing the n-type impurity into the n$^-$-type epitaxial layer 13. However, the present invention is not limited to this configuration. For example, it may also be possible to form the hole annihilation region by introducing an inert element such as, for example, helium (He) or argon (Ar), into the n$^-$-type epitaxial layer 13. In this case also, the impurity concentration of the inert element is, for example, about $1\times10^{15}$ to $1\times10^{22}$ cm$^{-3}$.

Further, the order of the steps of forming the n$^+$-type source region 15, p$^+$-type potential fixing region 16, the p$^+$-type semiconductor region 4, and the n-type hole annihilation region 6 is not limited to the order described above. These steps may be performed in any order as long as appropriately patterned suitably patterned resist films are used as masks in the steps. Further, it is also possible to use mask patterns including various films, instead of using the resist patterns including resist films.

Next, with respect to the steps of forming the n$^+$-type source region 15, the p$^+$-type potential fixing region 16, the p$^+$-type semiconductor region 4, and the n-type hole annihilation region 6, after each step or after all the steps are completed, the implanted impurities are activated by performing a heat treatment at about 1700° C.

Figure 10:
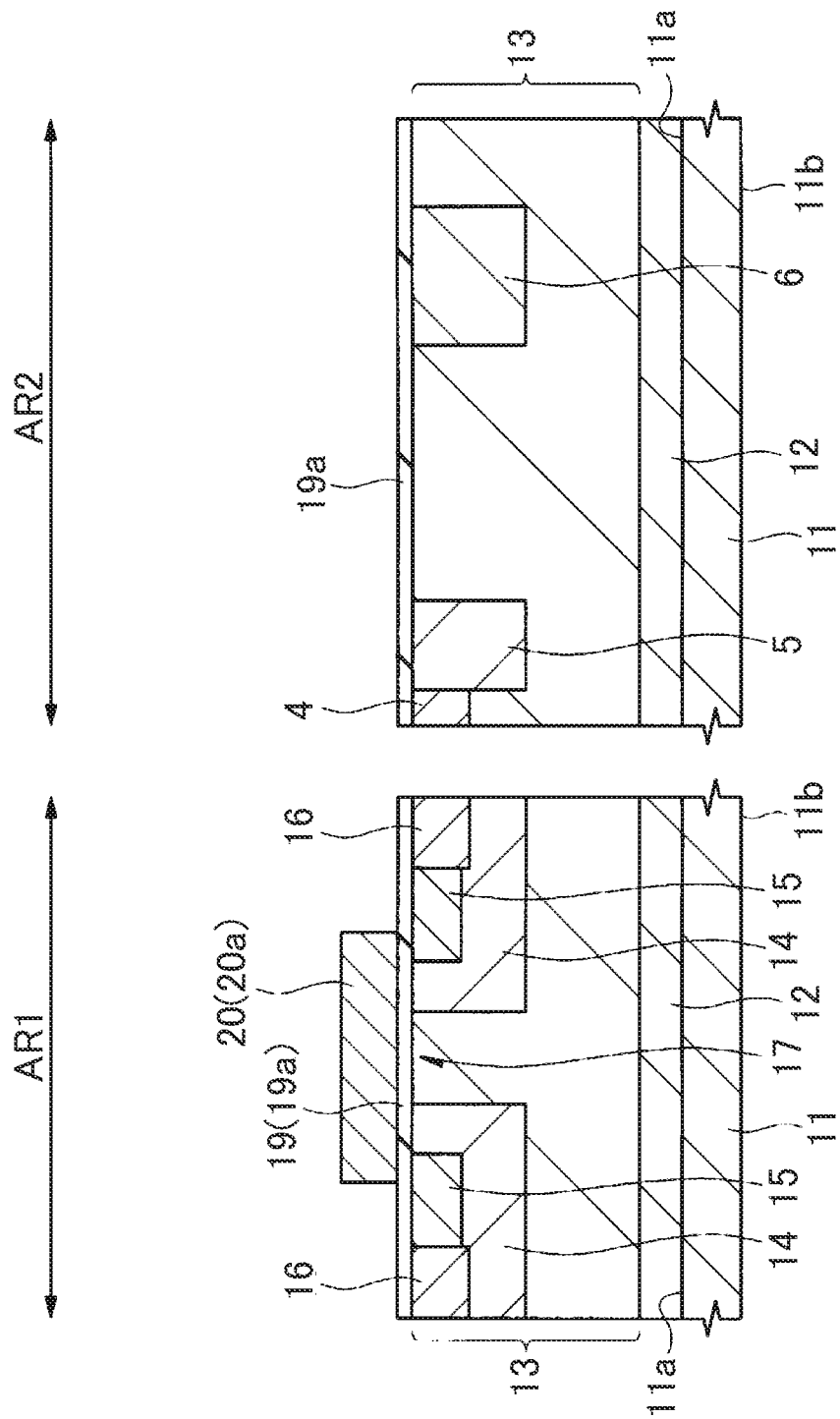
FIG. 10 is a fragmentary cross-sectional view showing the manufacturing process of the semiconductor device, continued from FIG. 9.

Next, as shown in FIG. 10, the method forms the gate insulating film 19 and the gate electrode 20 in each of the chip regions (step S18 in FIG. 4). First, the method forms an insulating film 19a on the upper surface of the n$^-$-type epitaxial layer 13. Preferably, various films including inorganic compounds, such as, for example, silicon oxide ($SiO_2$), silicon oxynitride (SiON), aluminum oxide ($Al_2O_3$), or hafnium oxide ($HfO_2$) can be used as the insulating film 19a. Alternatively, a laminated film in which the various films described above are laminated can preferably be used as the insulating film 19a. Further, the insulating film 19a can be formed by, for example, a CVD (Chemical Vapor Deposition) method.

Next, the method forms a conductive film 20a on the insulating film 19a. As the conductive film 20a, for example, a conductive film including polysilicon in which an n-type impurity such as phosphorus (P) or arsenic (As) is diffused at a high concentration can be used, or a conductive film including polysilicon in which a p-type impurity such as boron (B) is diffused at a high concentration can be used. Further, the conductive film 20a can be formed by, for example, the CVD method.

Next, the method forms the gate electrode 20 and the gate insulating film 19 by patterning the conductive film 20a and the insulating film 19a by photolithography and dry etching techniques. In the example shown in FIG. 10, the gate insulating film 19 is continuously formed over from the upper surface of a certain p-type body region 14 to the upper surface of the p-type body region 14 adjacent to the former p-type body region 14, including the JFET region 17 sandwiched between the two p-type body regions 14. Further, in the example shown in FIG. 10, the gate electrode 20 is continuously formed over from the upper surface of a certain p-type body region 14 to the p-type body region 14 adjacent to the former p-type body region 14, via the upper surface of the JFET region 17, with the gate insulating film 19 between these surfaces and the gate electrode 20.

Figure 11:
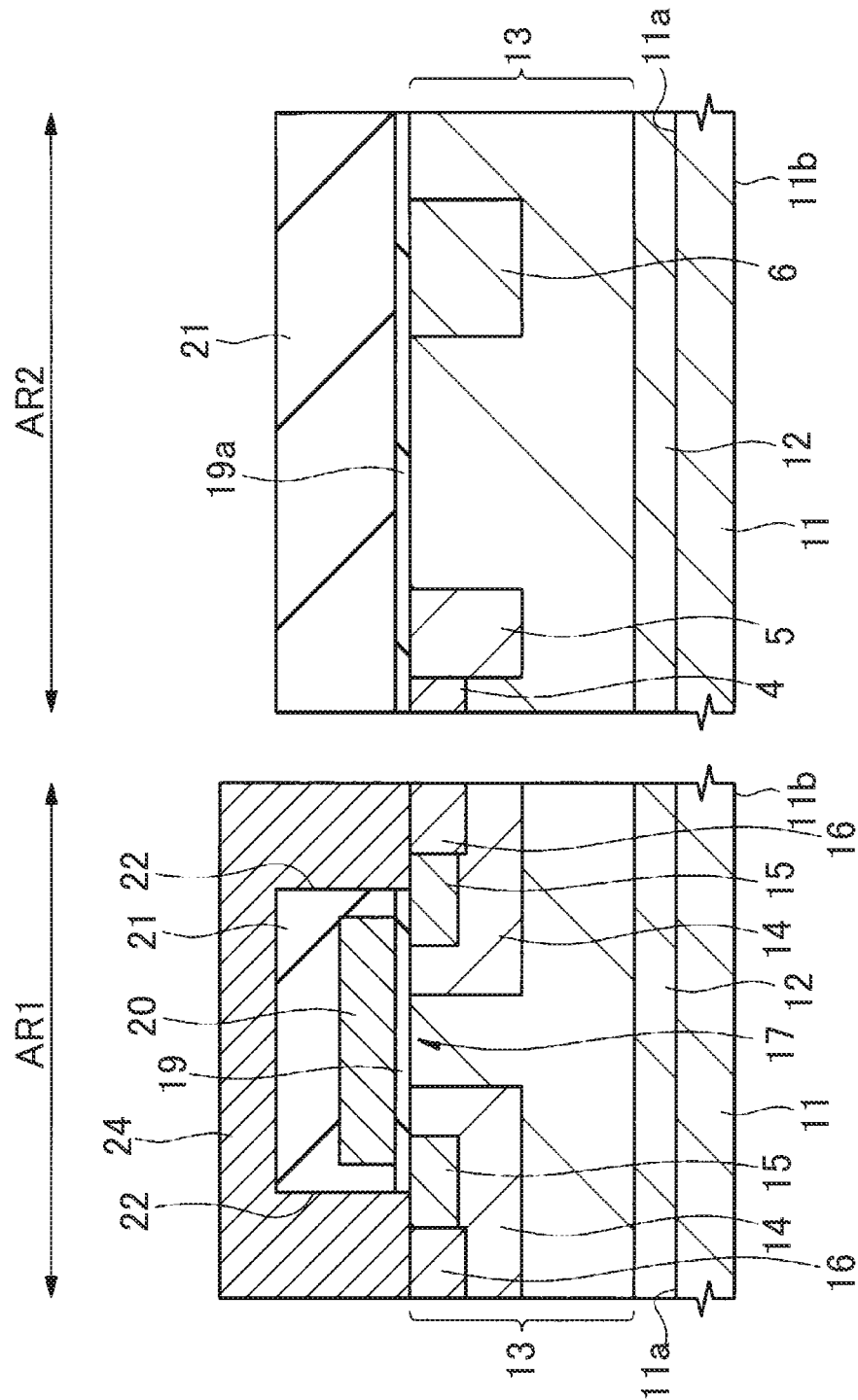
FIG. 11 is a fragmentary cross-sectional view showing the manufacturing process of the semiconductor device, continued from FIG. 10.

Next, as shown in FIG. 11, the method forms the interlayer insulating film 21 in each of the chip regions (step S19 in FIG. 4). At this time, the method forms the interlayer insulating film 21 over the $n^-$-type epitaxial layer 13 so as to cover the gate electrode 20 and the gate insulating film 19. For example, a film including silicon oxide ($SiO_2$), or the like, can be used as the interlayer insulating film 21. The interlayer insulating film 21 can be formed by, for example, the CVD method.

Next, the method forms the source wiring electrode 24 in each of the chip regions (step S20 in FIG. 4). First, the method forms an opening 22 in the active region AR1, passing through the interlayer insulating film 21 to reach the $n^+$-type source region 15 and the $p^+$-type potential fixing region 16 by using the photolithography and etching techniques. Part of the upper surface of the $n^+$-type source region 15 and the upper surface of the $p^+$-type potential fixing region 16 are exposed on the bottom of the opening 22.

Next, the method forms the source wiring electrode 24 by depositing a conductive film including titanium (Ti), aluminum (Al), or the like, on the upper surface of the interlayer insulating film 21 including the interior of the opening 22 by using a vapor deposition or sputtering method, and then by patterning the conductive film by using photolithography and etching techniques. Note that, although not shown, a drain wiring electrode that is electrically connected to the gate electrode 20 is also formed at the formation of the source wiring electrode 24.

Next, the method forms the drain wiring electrode 26 in each of the chip regions (step S21 in FIG. 4). For example, the method deposits a metal film including any one of titanium (Ti), nickel (Ni), gold (Au), and silver (Ag), or a laminated film in which two or more of the metal films are laminated, on a lower surface 11b of the $n^+$-type SiC substrate 11 in the active region AR1 and the end portion AR2 by the deposition or sputtering method. In this way, the drain wiring electrode 26 can be formed on the lower surface 11b of the $n^+$-type SiC substrate 11 in the active region AR1 and the termination region AR2. Thus, the semiconductor device 1 can be manufactured in each of the chip regions as shown in FIGS. 2 and 3.

Although not shown in FIGS. 2 and 3, after the formation of the drain wiring electrode 26, a passivation film can be formed on the upper surface of the semiconductor device 1 so as to cover the source wiring electrode 24 and the gate wiring electrode. Next, an opening can be formed in a portion of the passivation film in which a pad region is formed to electrically connect the gate wiring electrode and the source wiring electrode 24 to the outside.

Then, the method cuts the wafer, in which a plurality of semiconductor devices 1 are formed, along the first scribe region and the second scribe region that are provided on the four sides of each of the chips by dicing to separate into individual semiconductor devices 1.

In this way, according to the first embodiment, even if defects occur in the dicing surface 7 of the semiconductor device 1, the holes supplied from the p-type termination region 5 do not reach the dicing surface 7, so that it is possible to suppress the recombination of holes and electrons in the defects occurred in the dicing surface 7. Thus, it is possible to prevent that the defects occurred in the dicing surface 7 of the semiconductor device 1 are extended and a number of stacking faults occur in the $n^-$-type epitaxial layer 13 or the like. Thus, energization deterioration is not likely to occur even if the return current flows through the body diode DI, so that it is possible to prevent the electrical resistance, or the on-resistance from increasing when the on current flows through the semiconductor device 1. Further, because energization deterioration is not likely to occur even if the return current flows through the body diode ID incorporated into the semiconductor device 1, there is no need to provide an external diode separately from the body diode DI incorporated into the semiconductor device 1. Thus, the power module and the power converter can be miniaturized.

<Variation of the First Embodiment>

Figure 12:
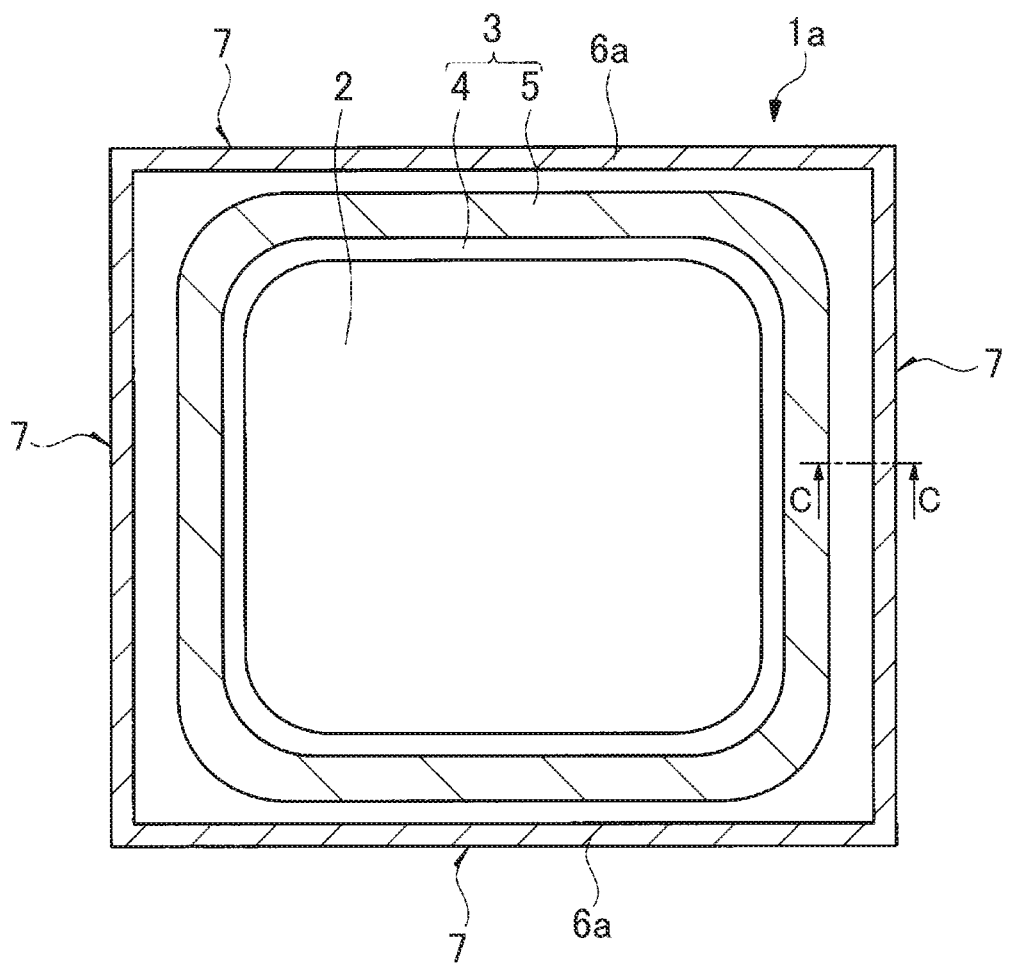
FIG. 12 is a fragmentary plan view showing an example of a semiconductor device (semiconductor chip) according to a variation of the first embodiment.
Figure 13:
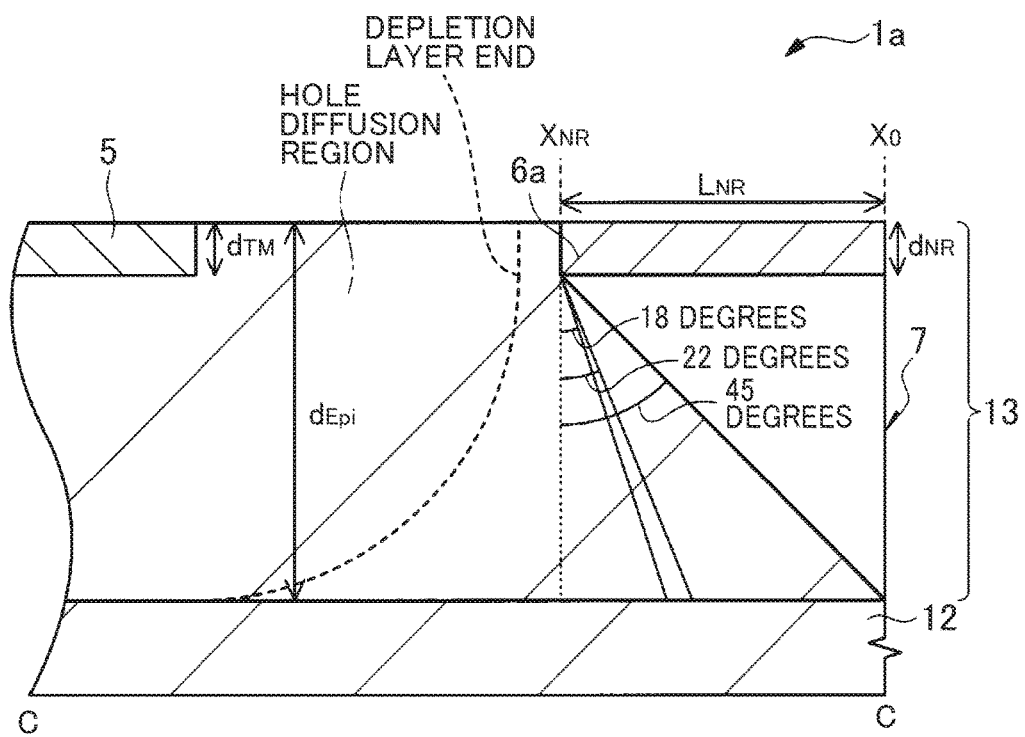
FIG. 13 is a fragmentary cross-sectional view showing an enlarged part of the end portion of the semiconductor device (semiconductor chip) according to the variation of the first embodiment.

A semiconductor device according to a variation of the first embodiment will be described with reference to FIGS. 12 and 13. FIG. 12 is a fragmentary plan view showing an example of a semiconductor device (semiconductor chip) according to the variation of the first embodiment. FIG. 13 is a fragmentary cross-sectional view (cross-sectional view taken along line C-C shown in FIG. 12) showing an enlarged part of the end portion of the semiconductor device (semiconductor chip) according to the variation of the first embodiment. Note that the difference between the semiconductor device according to the variation and the semiconductor device 1 described above is the shape of the n-type hole annihilation region, so that the n-type hole annihilation region will be described in detail here. The other configurations are substantially the same as the semiconductor device 1 described above and the description thereof will be omitted.

As shown in FIG. 12, similarly to the semiconductor device 1 described above, a semiconductor device (one semiconductor chip) 1a is configured with an active region (element forming region, activation region) 2 through which current mainly flows, and a peripheral region 3 formed around the active region 2 in a plan view.

For example, a plurality of n-channel type SiC-MOSFETs are connected in parallel to the active region 2. Further, a termination structure, for example, $p^+$-type semiconductor region 4 and p-type termination region (termination) 5, is formed in the peripheral region 3 in order to prevent concentration of electric field. In other words, the p-type termination region 5 is formed so as to surround the $p^+$-type semiconductor region 4 in a plan view. The p-type termination region 5 includes, for example, a junction termination extension (JTE) structure having a single- or multi-stage concentration distribution.

Further, on the outer periphery (termination, end portion) of the semiconductor device 1a than the peripheral region 3, an n-type hole annihilation region 6a is formed apart from the p-type termination region 5. The n-type hole annihilation region 6a also has a function as a channel stopper.

FIG. 13 shows an example of the arrangement of the p-type termination region 5 and the n-type hole annihilation region 6a that are formed in the end portion of the semiconductor device 1a.

The n-type hole annihilation region 6a is formed apart from the p-type termination region 5 on the periphery of the p-type termination region 5 in a plan view. In the semiconductor device 1 described above, the n-type hole annihilation region 6 is apart from the dicing surface 7 of the semiconductor device 1. However, in the semiconductor device 1a according to the variation, the n-type hole annihilation region 6a is formed also over the dicing surface 7 of the semiconductor device 1.

Thus, the width ($L_{NR}$) of the n-type hole annihilation region 6a in a plan view is equal to $|X_{NR}|$ which is the distance between the dicing surface 7 of the semiconductor device 1a and the end surface of the n-type annihilation region 6a that faces the p-type termination region 5. The distance between the p-type termination region 5 and the n-type hole annihilation region 6a is set according to the breakdown voltage of the semiconductor device 1a, in such a way that the depletion layer end extending from the p-type termination region 5 at the time of non-energization (off state) will not reach the n-type hole annihilation region 6 and punch-through will not occur.

Further, the n-type hole annihilation region 6a has a predetermined depth ($d_{NR}$) from the upper surface of the n⁻-type epitaxial layer 13. The depth ($d_{NR}$) is equal to or more than the depth ($d_{TM}$) of the p-type termination region 5, which is located at a position closest to the n-type hole annihilation region 6a and facing the n-type hole annihilation region 6a, from the upper surface of the n⁻-type epitaxial layer 13. The depth ($d_{NR}$) of the n-type hole annihilation region 6a is, for example, about 0.5 µm.

Further, the n-type hole annihilation region 6a is provided in such a way that the sum of the width ($L_{NR}$) of the n-type hole annihilation region 6a in a plan view and the depth ($d_{NR}$) of the n-type hole annihilation region 6a is equal to or more than the thickness ($d_{Epi}$) of the n⁻-type epitaxial layer 13.

To summarize the above, the following equation is obtained:

$$d_{NR} \geq d_{TM}$$

$$(L_{NR}+d_{NR}) \geq d_{Epi}$$

It is possible to obtain substantially the same effect as the n-type hole annihilation region 6 formed in the semiconductor device 1 described above, by forming the n-type hole annihilation region 6a so as to satisfy the above equation.

Further, also in the semiconductor device 1a according to the variation, the position of the n-type hole annihilation region 6a is set by taking into account the diffusion of holes in the direction of the dicing surface 7 of the semiconductor substrate 1a. In other words, the n-type annihilation region 6a is provided in such a way that the sum of the width ($L_{NR}$) of the n-type hole annihilation region 6a and the depth ($d_{NR}$) of the n-type hole annihilation region 6a is equal to or more than the thickness ($d_{Epi}$) of the n⁻-type epitaxial layer 13.

Further, in the semiconductor device 1a according to the first variation, when the n-type hole annihilation region 6a is formed, the upper part of the dicing region is converted to amorphous by introducing an n-type impurity also in the dicing region by using the ion implantation method. In this way, it is possible to suppress the defects that occur in the dicing surface 7 of the semiconductor device 1a during dicing.

Second Embodiment

<Power Module, Power Converter and Three-Phase Motor System>

A power module, a power converter, and a three-phase motor system including the power converter according to a second embodiment will be described. The power module according to the second embodiment includes the semiconductor device according to the first embodiment described above. Note that the power module according to the second embodiment is configured such that the semiconductor device 1 is applied to a three-phase inverter.

Figure 14:
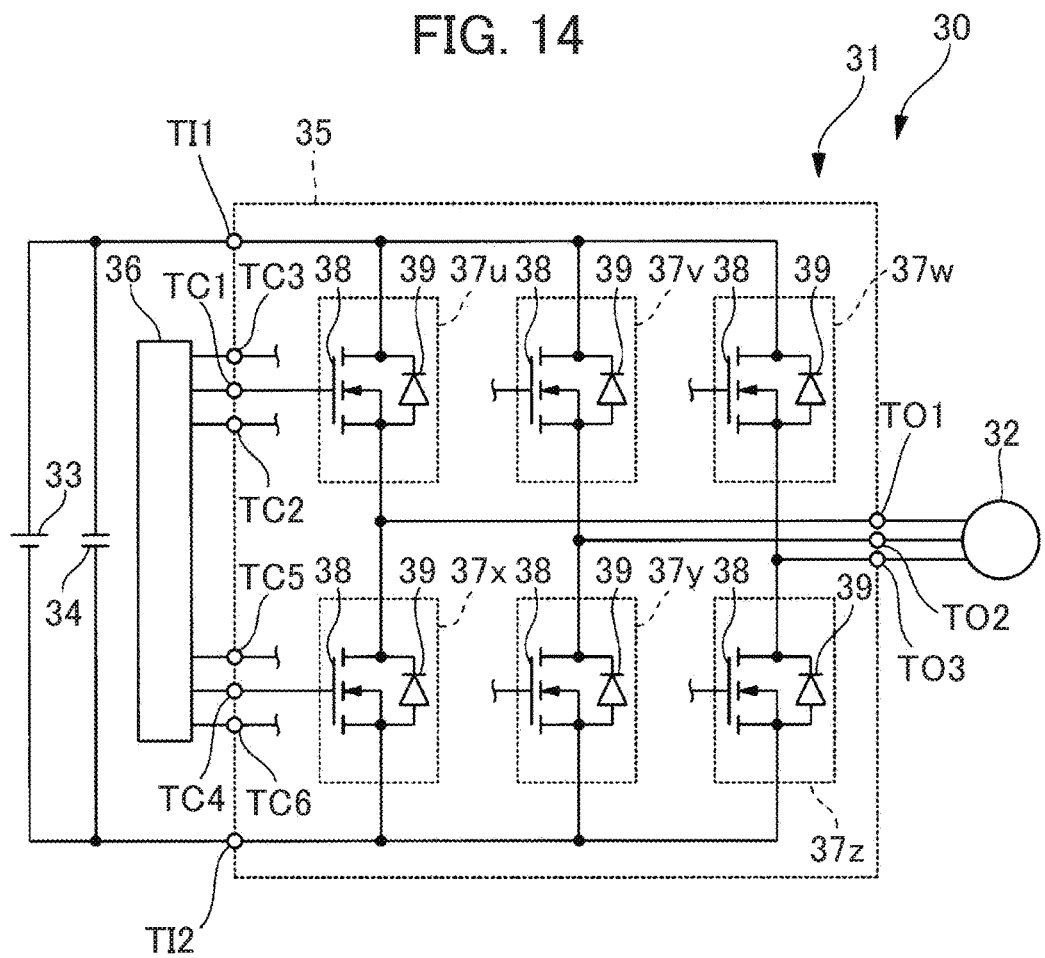
FIG. 14 is a diagram showing the configuration of a three-phase motor system according to a second embodiment.

FIG. 14 is a diagram showing the configuration of a three-phase motor system according to the second embodiment.

As shown in FIG. 14, a three-phase motor system 30 includes a power converter 31 as an inverter device, a load 32 including a three-phase motor or the like, a DC power supply 33, and a capacitance 34 including a capacitor or the like. The power converter 31 includes a power module 35 as a three-phase inverter circuit, and a control circuit 36. The load 32 is connected to output terminals TO1, TO2, and TO3, which are three-phase output terminals of the power module 35. Further, the DC power supply 33 and the capacitance 34 are connected in parallel to each other between two input terminals of the power module 35, input terminal TI1 and input terminal TI2.

The power module 35 as a three-phase inverter circuit has switching elements 37u, 37v, 37w, 37x, 37y, and 37z. The switching elements 37u and 37x are connected in series between the input terminal TI1 and the input terminal TI2. The switching elements 37v and 37y are connected in series between the input terminal TI1 and the input terminal TI2. The switching elements 37w and 37z are connected in series between the input terminal TI1 and the input terminal TI2.

Each of the switching elements 37u, 37v, 37w, 37x, 37y, and 37z includes a MOSFET 38 and a body diode 39. The semiconductor device 1 according to the first embodiment can be used as each of the switching elements 37u, 37v, 37w, 37x, 37y, and 37z. Further, the body diode DI incorporated into the semiconductor device 1 can be used as the body diode 39.

Gate electrodes of a plurality of MOSFETs 38, which are provided in the respective switching elements 37u, 37v, 37w, 37x, 37y, and 37z, are respectively connected to control terminals TC1, TC2, TC3, TC4, TC5, and TC6 which are six control terminals of the power module 35. Further, the control circuit 36 is connected to each of the control terminals TC1, TC2, TC3, TC4, TC5, and TC6. Thus, the control circuit 36 is connected to each of the gate electrodes of the MOSFETs 38 provided in the respective switching elements 37u, 37v, 37w, 37x, 37y, and 37z. The control circuit 36 drives the switching elements 37u, 37v, 37w, 37x, 37y, and 37z.

The control circuit 36 drives each of the switching elements 37u, 37v, 37w, 37x, 37y, and 37z in such a way that the on and off states of each of the switching elements 37u, 37v, 37w, 37x, 37y, and 37z are alternately switched at a predetermined timing. In this way, AC voltages three phases of U phase, V phase, and W phase are generated to convert DC power to AC power of three phases. The load 32 is driven by the three-phase AC power.

<Main Features and Effects of the Second Embodiment>

The semiconductor device 1 according to the first embodiment can be used as each of the switching elements 37u, 37v, 37w, 37x, 37y, and 37z in the power module 35 included in the power converter 31 according to the second embodiment.

In this way, it is possible to prevent or suppress the occurrence of energization deterioration in the semiconductor device 1 when the return current flows through the body diode DI incorporated into the semiconductor device 1. Thus, it is possible to reduce the power loss in power conversion. Further, there is no need to perform synchronous rectification with high accuracy by using the control circuit 36, so that the design margin of the power module 35 and the power converter 31 can be increased. In this way, it is possible to increase the performance of the power module 35 and the power converter 31. Or more specifically, there is no need to provide an external diode separately from the body diode DI, so that the power module 35 and the power converter 31 can be miniaturized.

Third Embodiment

<Automobile>
An automobile according to a third embodiment will be described. The automobile according to the third embodiment is an automobile including the power converter according to the second embodiment, such as a hybrid or electric vehicle.

Figure 15:
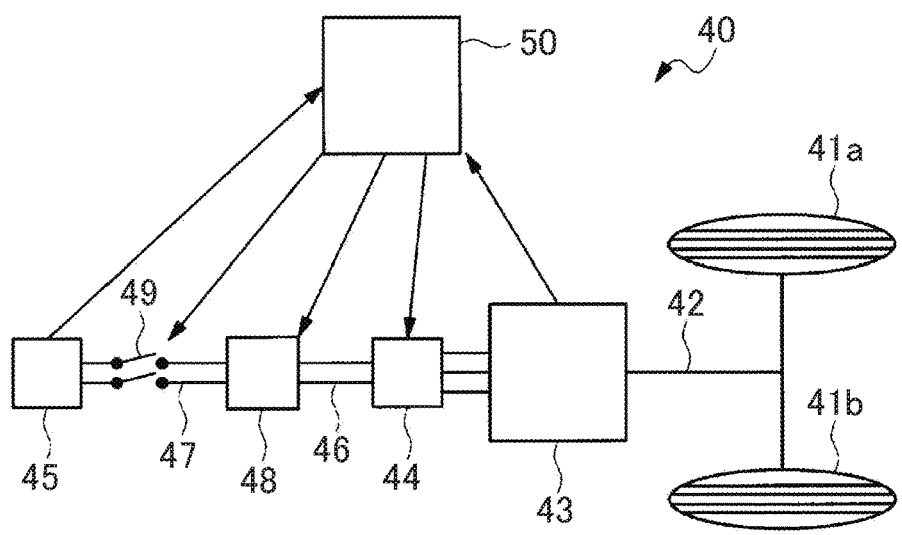
FIG. 15 is a diagram showing the configuration of an electric vehicle as an automobile according to a third embodiment.
Figure 16:
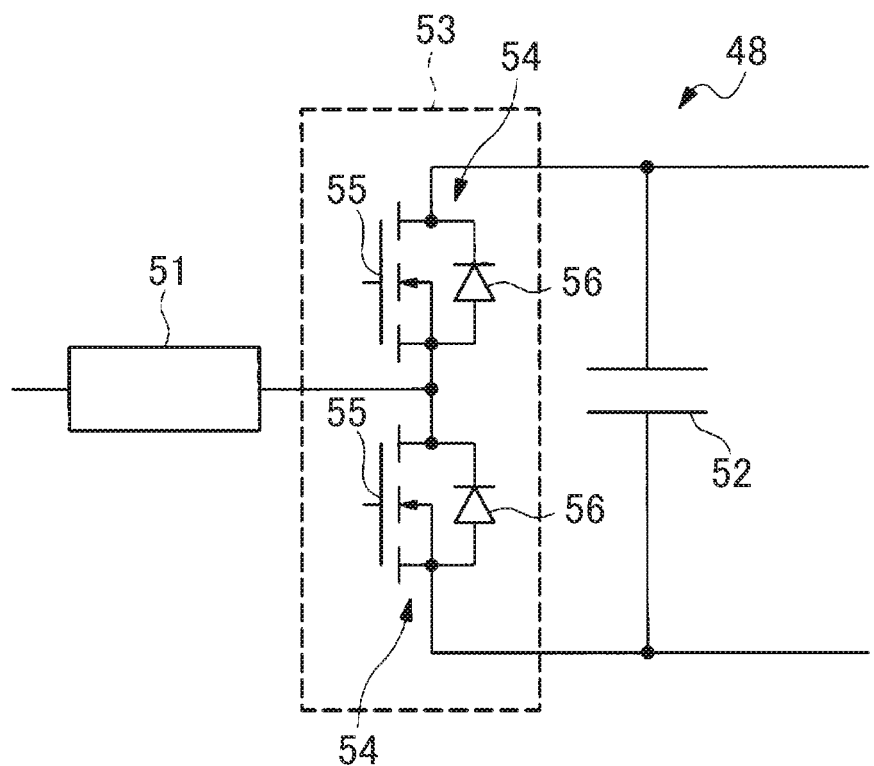
FIG. 16 is a circuit diagram showing a boost converter device in the automobile according to the third embodiment.

FIG. 15 is a diagram showing the configuration of an electric vehicle as the automobile according to the third embodiment. FIG. 16 is a circuit diagram showing a boost converter in the automobile according to the third embodiment.

As shown in FIG. 15, an automobile 40, as an electric vehicle, includes: a three-phase motor 43 capable of inputting and outputting power to a drive shaft 42 to which drive wheels 41a and 41b are connected; an inverter device 44 for driving the three-phase motor 43; and a battery 45. Further, the automobile 40 also includes a boost converter device 48, a relay 49, and an electronic control unit 50. The boost converter device 48 is connected to the inverter device 44 to which a power line 46 is connected, and to the power line 47 to which the battery 45 is connected.

The three-phase motor 43 is a synchronous motor including a rotor in which a permanent magnet is embedded, and a stator around which a three-phase coil is wound. The power converter 31 (see FIG. 14) described in the second embodiment can be used as the inverter device 44.

As shown in FIG. 16, the boost converter device 48 is configured such that a reactor 51 and a smoothing capacitor 52 are connected to the inverter device 53. The inverter device 53 is similar to part of the inverter circuit included in the power module 35 described above in the second embodiment. Further, a MOSFET 55 and a body diode 56 included in the switching element 54 in the inverter device 53 are similar to the MOSFET 38 and the body diode 39, respectively, described above in the second embodiment.

The electronic control unit 50 includes a microprocessor, a storage device, and an input/output port. The electronic control unit 50 receives a signal from a sensor that detects the rotor position of the three-phase motor 43 or charge and discharge values of the battery 45. Then, the electronic control unit 50 outputs a signal to control the inverter device 44, the boost converter device 48, and the relay 49.

<Main Features and Effects of the Third Embodiment>

The power converter 31 (see FIG. 14) according to the second embodiment above can be used as the inverter device 44 of the automobile 40 according to the third embodiment. The semiconductor device 1 according to the first embodiment can be used as each of the switching elements 37u, 37v, 37w, 37x, 37y, and 37z that are included in the power converter 31. Or more specifically, the semiconductor device 1 according to the first embodiment above can be used as the switching element 54 provided in the inverter device 53 within the boost converter device 48 of the automobile 40 according to the third embodiment.

In this way, similarly to the first embodiment above, it is possible to prevent or suppress the occurrence of energization deterioration in the semiconductor device 1 when the return current flows through the body diode DI incorporated into the semiconductor device 1. Thus, it is possible to reduce the power loss in power conversion. Further, there is no need to perform synchronous rectification with high accuracy by using the control circuit 36, so that the design margin of the power module 35 and the power converter 31 can be increased. In this way, it is possible to increase the performance of the power module 35 and the power converter 31. Or more specifically, there is no need to provide an external diode separately from the body diode DI, so that the power module 35 and the power converter 31 can be miniaturized.

Along with those described above, in the automobile 40 according to the second embodiment, the power loss can be reduced in power conversion in the inverter device 44 and the boost converter device 48, so that there will be no need to provide a large cooling system. Thus, due to miniaturization of the cooling system or other design features, it is possible to easily reduce the cost and size or weight of the inverter device 44 and the boost converter device 48. In this way, the volume of the drive system that occupies the automobile 40 as the electric vehicle can be reduced. As a result, it is possible to easily reduce the cost and size or weight of the automobile 40 as an electric vehicle. Or more specifically, it is possible to increase the degree of freedom in the design of the automobile 40 as an electric vehicle, such as being able to increase the interior space of the automobile 40 as an electric vehicle.

Note that the third embodiment has described an example of applying the automobile including the power converter 31 according to the second embodiment to an electric vehicle. However, it is also possible to similarly apply the automobile including the power converter 31 according to the second embodiment to a hybrid vehicle using an engine in combination with a motor. Further, the hybrid vehicle to which the power converter 31 according to the second embodiment is applied also has the same effect as the electric vehicle to which the power converter 31 according to the second embodiment is applied.

Forth Embodiment

<Railway Vehicle>
A railway vehicle according to a fourth embodiment will be described. A railway vehicle according to the fourth embodiment is a railway vehicle including the power converter according to the second embodiment described above.

Figure 17:
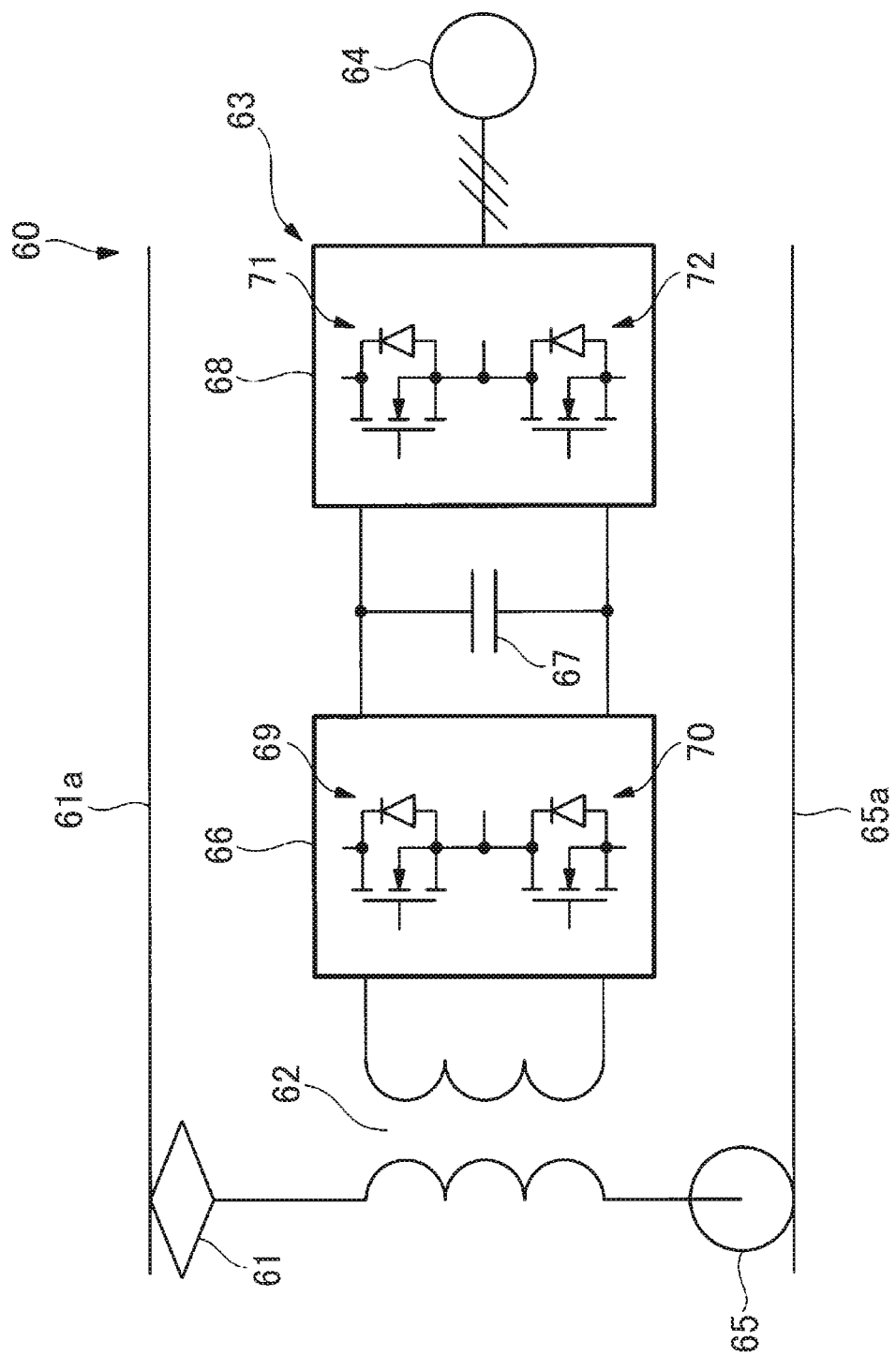
FIG. 17 is a diagram showing the configuration of a railway vehicle according to a fourth embodiment.

FIG. 17 is a diagram showing the configuration of a railway vehicle according to the fourth embodiment.

As shown in FIG. 17, a railway vehicle 60 includes a pantograph 61 as a current collector, a transformer 62, a power converter 63, a load 64 which is an AC motor, and a wheel 65. The power converter 63 has a converter device 66, a capacitance 67 which is, for example, a capacitor, and an inverter device 68.

The converter device 66 has switching elements 69 and 70. The switching element 69 is provided on the upper arm side, namely, on the high voltage side. The switching element 70 is provided on the lower arm side, namely, on the low voltage side. Note that in FIG. 17, the switching elements 69 and 70 are shown with respect to one of a plurality of phases.

The inverter device 68 has switching element 71 and 72. The switching element 71 is provided on the upper arm side, namely, on the high voltage side. The switching element 72 is provided on the lower arm side, namely, on the low voltage side. Note that in FIG. 17, the switching elements 71 and 72 are shown with respect to one of the three phases of U phase, V phase, and W phase.

An end on the primary side of the transformer 62 is connected to an overhead wire 61a through the pantograph 61. The other end on the primary side of the transformer 62 is connected to a railway track 65a through the wheel 65. An end on the secondary side of the transformer 62 is connected to a terminal of the converter device 66 on the upper arm side on the opposite side of load 64. The other end on the secondary side of the transformer 62 is connected to a terminal of the converter device 66 on the lower arm side on the opposite side of the load 64.

A terminal on the upper arm side of the converter device 66 on the side of the load 64 is connected to a terminal on the upper arm side of the inverter device 68 on the opposite side of the load 64. Further, a terminal on the lower arm side of the converter device 66 on the side of the load 64 is connected to a terminal on the lower arm side of the inverter device 68 on the opposite side of the load 64. Further, the capacitance 67 is connected between the terminal on the upper arm side of the inverter device 68 on the opposite side of the load 64 and the terminal on the lower arm side of the inverter device 68 on the opposite side of the load 64. Further, although not shown in FIG. 17, the three terminals on the output side of the inverter device 68 are connected to the load 64, respectively as U-phase, V-phase, and W-phase.

In the fourth embodiment, the power converter 31 (see FIG. 14) according to the second embodiment can used as the inverter device 68.

The AC power that is collected by the pantograph 61 from the overhead wire 61a is transformed in voltage with the transformer 62 and is converted to a desired DC power by the converter device 66. The voltage of the DC power converted by the converter device 66 is smoothed by the capacitance 67. Then, the DC power with the voltage smoothed by the capacitance 67 is converted to AC power by the inverter device 68. The AC power converted by the inverter device 68 is supplied to the load 64. The load 64 to which the AC power is supplied rotates and drives the wheel 65. Thus, the railway vehicle is accelerated.

<Main Features and Effects of the Fourth Embodiment>

The power converter 31 (see FIG. 14) according to the second embodiment can be used as the inverter device 68 of the railway vehicle 60 according to the fourth embodiment. The semiconductor device 1 according to the first embodiment can be used as each of the switching elements 37u, 37v, 37w, 37x, 37y, and 37z.

In this way, similarly to the first embodiment, it is possible to prevent or suppress the occurrence of energization deterioration in the semiconductor device 1 when the return current flows through the body diode DI that is incorporated into the semiconductor device 1. Thus, it is possible to reduce the power loss in power conversion. Further, there is no need to perform synchronous rectification with high accuracy by using the control circuit 36, so that the design margin of the power module 35 and the power converter 31 can be increased. In this way, it is possible to increase the performance of the power module 35 and the power converter 31. Or more specifically, there is no need to provide an external diode separately from the body diode DI, so that the power module 35 and the power converter 31 can be miniaturized.

Along with these features, the railway vehicle 60 according to the fourth embodiment can reduce the power loss in power conversion in the inverter device 68, so that there will be no need to provide a large cooling system. Thus, due to miniaturization of the cooling system or other design features, it is possible to easily reduce the cost and size or weight of the inverter device 68. In this way, it is possible to easily reduce the cost of the railway vehicle 60 including the inverter device 68, and to increase the energy efficiency in operating the train.

Or more specifically, it is possible to use the semiconductor device 1 according to the first embodiment as the switching elements 69 and 70 included in the converter device 66. In this case also, the power loss in power conversion in the converter device 66 can be reduce, so that it is possible to easily reduce the cost and size or weight of the converter device 66. Thus, it is possible to easily reduce the cost of the railway vehicle 60 including the converter device 66 and to increase the energy efficiency in operating the train.

While the invention made by the inventors has been concretely described based on the embodiments, the present invention is not limited to the exemplary embodiments. It is apparent to those skilled in the art that various modifications and variations can be made without departing from the scope of the present invention.

LIST OF REFERENCE SINGS 1, 1a Semiconductor device (semiconductor chip)
2 Active region (element formation region, activation region)
3 Peripheral region
4 $p^+$-type semiconductor region
5 P-type termination region (termination)
6, 6a n-type hole annihilation region
7 Dicing surface
11 $n^+$-type SiC substrate
11a Upper surface
11b Lower surface
12 n-type buffer layer
13 $n^-$-type epitaxial layer
14 p-type body region (well region)
15 $n^+$-type source region
16 $p^+$-type potential fixing region
17 JFET region (doped region)
18 Channel region
19 Gate insulating film
19a Insulating film
20 Gate electrode
20a Conductive film
21 Interlayer insulating film
22 Opening
24 Source wiring electrode
26 Drain wiring electrode
30 Three-phase motor system
31 Power converter
32 Load
33 DC power supply
34 Capacitance
35 Power module
36 Control circuit
37u, 37v, 37w, 37x, 37y, 37z Switching element
38 MOSFET
39 Body diode
40 Automobile
41a, 41b Drive wheel
42 Drive shaft
43 Three-phase motor
44 Inverter device
45 Battery
46, 47 Power line 48 Boost converter device
49 Relay
50 Electronic control unit
51 Reactor
52 Smoothing capacitor
53 Inverter device
54 Switching element
55 MOSFET
56 Body diode
60 Railway vehicle
61 Pantograph
61a Overhead wire
62 Transformer
63 Power converter
64 Load
65 Wheel
65a Railway track
66 Converter device
67 Capacitance
68 Inverter device
69, 70, 71, 72 Switching element
DI Body diode
OP1, OP2, OP3, OP4 Opening
RP1, RP2, RP3, RP4 Resist pattern
T11, T12 Input terminal
TC1, TC2, TC3, TC4, TC5, TC6 Control terminal
TO1, TO2, TO3 Output terminal

The invention claimed is:
1. A semiconductor device comprising:
a substrate comprising silicon carbide of a first conductivity type;
a semiconductor layer of the first conductivity type that is formed on a first main surface of the substrate;
an element formation region provided in a central part of the semiconductor layer in a plan view;
a first semiconductor region of a second conductivity type different from the first conductivity type, having a first depth from an upper surface of the semiconductor layer and formed annularly in the semiconductor layer outside the element formation region in a plan view; and
a second semiconductor region of the first conductivity type, having a second depth from the upper surface of the semiconductor layer and formed annularly in the semiconductor layer between the first semiconductor region and the periphery of the semiconductor layer, apart from the first semiconductor region and apart from the periphery of the semiconductor layer in a plan view,
wherein the second semiconductor region includes a first end surface facing the first semiconductor region, as well as a second end surface on the opposite side of the first end surface, and
wherein when the first depth is $d_{TM}$, the second depth is $d_{NR}$, a thickness of the semiconductor layer is $d_{Epi}$, a distance from the first end surface of the second semiconductor region to the second end surface thereof is $L_{NR}$, and a distance from the first end surface of the second semiconductor region to the periphery of the semiconductor layer is $|X_{NR}|$ these variables have the following relationship:

$$d_{NR} \geq d_{TM}$$

$$(|X_{NR}| + d_{NR}) \geq d_{Epi}$$

$$0 < L_{NR} < |X_{NR}|.$$

2. The semiconductor device according to claim 1, wherein an impurity contained in the second semiconductor region is nitrogen, arsenic, or phosphorus.

3. The semiconductor device according to claim 1, wherein an impurity contained in the second semiconductor region is an inert element.
4. The semiconductor device according to claim 1, wherein the impurity concentration of the second semiconductor region is $1 \times 10^{15}$ to $1 \times 10^{22}$ cm$^{-3}$.
5. A power converter comprising a power module configured with the semiconductor device according to claim 1.
6. A three-phase motor system that drives a three-phase motor by using the power converter according to claim 5.
7. An automobile with wheels driven by the three-phase motor system according to claim 6.
8. A railway vehicle with wheels driven by the three-phase motor system according to claim 6.
9. A semiconductor device comprising:
a substrate comprising silicon carbide of a first conductivity type;
a semiconductor layer of the first conductivity type that is formed on a first surface of the substrate;
an element formation region provided in a central part of the semiconductor layer in a plan view;
a first semiconductor region of a second conductivity type different from the first conductivity type, having a first depth from an upper surface of the semiconductor layer and formed annularly in the semiconductor layer outside the element formation region in a plan view; and
a second semiconductor region of the first conductivity type, having a second depth from the upper surface of the semiconductor layer and formed annularly in the semiconductor layer between the first semiconductor region and the periphery of the semiconductor layer, apart from the first semiconductor region in a plan view,
wherein the second semiconductor region includes a first end surface facing the first semiconductor region as well a second end surface on the opposite side of the first end surface, and the second end surface is on the same surface as the side surface of the periphery of the semiconductor layer, and
wherein when the first depth is $d_{TM}$, the second depth is $d_{NR}$, a thickness of the semiconductor layer is $d_{Epi}$, and a distance from the first end surface of the second semiconductor region to the second end surface thereof is $L_{NR}$, these variables have the following relationship:

$$d_{NR} \geq d_{TM}$$

$$(L_{NR} + d_{NR}) \geq d_{Epi}.$$

10. The semiconductor device according to claim 9, wherein the second end surface of the second semiconductor region is amorphous.
11. The semiconductor device according to claim 9, wherein an impurity contained in the second semiconductor region is nitrogen, arsenic, or phosphorus.
12. The semiconductor device according to claim 9, wherein an impurity contained in the second semiconductor region is an inert element.
13. The semiconductor device according to claim 9, wherein the impurity concentration of the second semiconductor region is $1 \times 10^{15}$ to $1 \times 10^{22}$ cm$^{-3}$.
14. A method of manufacturing a semiconductor device, including:
(a) a step of preparing a wafer in which a semiconductor layer comprising silicon carbide of a first conductivity type is formed on a first surface of a substrate including silicon carbide of the first conductivity type, by an epitaxial growth method;

(b) a step of forming an annular first semiconductor region in each of a plurality of chip regions surrounded by a plurality of first scribe regions separate from each other in a first direction while extending in a second direction perpendicular to the first direction, and surrounded by a plurality of second scribe regions separate from each other in the second direction while extending in the first direction, by ion implantation of an impurity of a second conductivity type different from the first conductivity type into the semiconductor layer outside an element formation region in a plan view, from an upper surface of the semiconductor layer;

(c) a step of forming an annular second semiconductor region in each of the plurality of chip regions, apart from the first semiconductor region, by ion implantation of an impurity of the first conductivity type between the first semiconductor region and the first scribe region, and between the first semiconductor region and the second scribe region, from the upper surface of the semiconductor layer; and (d) a step of cutting the wafer along the first scribe region and the second scribe region, wherein in the (c) step, the second semiconductor region is formed in such a way that when a first depth from the upper surface of the semiconductor layer of the first semiconductor region is $d_{TM}$, a second depth from the upper surface of the semiconductor layer of the second semiconductor region is $d_{NR}$, a thickness of the semiconductor layer is $d_{Epi}$, a distance from the first end surface of the second semiconductor region that faces the first semiconductor region to the second end surface on the opposite side of the first end surface is $L_{NR}$, and a distance from the first end surface of the second semiconductor region to the first scribe region or the second scribe region is $|X_{NR}|$, these variables have the following relationship:

$$d_{NR} \geq d_{TM}$$

$$(|X_{NR}| + d_{NR}) \geq d_{Epi}$$

$$0 < L_{NR} < |X_{NR}|.$$

15. The method of manufacturing a semiconductor device according to claim 14, wherein the impurity concentration of the second semiconductor region is $1\times10^{15}$ to $1\times10^{22}$ cm$^{-3}$.

* * * * *